United States Patent
Sonokawa et al.

(10) Patent No.: US 8,114,575 B2
(45) Date of Patent: Feb. 14, 2012

(54) PLATE MAKING METHOD OF LITHOGRAPHIC PRINTING PLATE PRECURSOR

(75) Inventors: Koji Sonokawa, Shizuoka (JP); Chiaki Kawamoto, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 548 days.

(21) Appl. No.: 12/212,287

(22) Filed: Sep. 17, 2008

(65) Prior Publication Data

US 2009/0075208 A1 Mar. 19, 2009

(30) Foreign Application Priority Data

Sep. 18, 2007 (JP) .................... 2007-240744

(51) Int. Cl.
- G03C 5/26 (2006.01)
- G03F 7/26 (2006.01)
- G03F 7/00 (2006.01)
- B41N 1/00 (2006.01)

(52) U.S. Cl. ............. 430/302; 430/273.1; 101/453; 101/463.1

(58) Field of Classification Search ........... 430/270.1, 430/302
See application file for complete search history.

(56) References Cited

U.S. PATENT DOCUMENTS

| 6,902,865 | B2 | 6/2005 | Teng | |
|---|---|---|---|---|
| 2004/0224258 | A1* | 11/2004 | Maemoto | 430/270.1 |
| 2006/0024612 | A1* | 2/2006 | Oshima et al. | 430/270.1 |
| 2006/0046199 | A1 | 3/2006 | Mitsumoto et al. | |
| 2006/0051701 | A1* | 3/2006 | Taguchi et al. | 430/270.1 |
| 2007/0287098 | A1* | 12/2007 | Inno | 430/302 |
| 2008/0081295 | A1* | 4/2008 | Adachi | 430/302 |

FOREIGN PATENT DOCUMENTS

| EP | 1 342 568 A1 | 9/2003 |
|---|---|---|
| EP | 1 788 444 A1 | 5/2007 |
| JP | 2006-106700 A | 4/2006 |
| WO | WO-2005/111727 A1 | 11/2005 |

* cited by examiner

*Primary Examiner* — Cynthia Kelly
*Assistant Examiner* — Chanceity Robinson
(74) *Attorney, Agent, or Firm* — Birch, Stewart, Kolasch & Birch, LLP

(57) ABSTRACT

A plate making method of a lithographic printing plate precursor includes: exposing a lithographic printing plate precursor including an image-recording layer and a support; and developing the exposed lithographic printing plate precursor to prepare a lithographic printing plate, wherein the developing includes, in the following order, (i) a process of removing an unexposed area of the image-recording layer with a gum solution, (ii) a process of washing with water and (iii) a process of oil-desensitizing a non-image area with a gum solution.

7 Claims, 1 Drawing Sheet

PLATE MAKING METHOD OF LITHOGRAPHIC PRINTING PLATE PRECURSOR

FIELD OF THE INVENTION

The present invention relates to a plate making method of a lithographic printing plate precursor. More particularly, it relates to a plate making method of a lithographic printing plate precursor comprising exposing a lithographic printing plate precursor capable of undergoing image recording with laser and capable of undergoing non-alkali development and developing the exposed lithographic printing plate precursor to prepare a lithographic printing plate.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate making according to a method of exposing the lithographic printing plate precursor through an original, for example, a lith film, and then while leaving the image-recording layer corresponding to the image area, removing the unnecessary image-recording layer corresponding to the non-image area by dissolving with an alkaline developer or a developer containing an organic solvent thereby revealing the hydrophilic surface of support.

In the hitherto known plate making process of lithographic printing plate precursor, after exposure, the step of removing the unnecessary image-recording layer by dissolving, for example, with a developer is required. However, it is one of the subjects to simplify such an additional wet treatment described above. Particularly, since disposal of liquid wastes discharged accompanying the alkali development processing of high pH has become a great concern throughout the field of industry in view of the consideration for global environment in recent years, as one means for the simplification, it has been strongly desired to conduct the development with a nearly neutral aqueous solution.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate technique of carrying digitalized image information on highly converging radiation, for example, a laser beam and conducting scanning exposure of a lithographic printing plate precursor with the radiation thereby directly preparing a lithographic printing plate without using a lith film. Thus, it is one of the important technical subjects to obtain a lithographic printing plate precursor adaptable to the technique described above.

In the case where the simplified plate making operation as described above is carried out under printing environment, an image-recording layer after imagewise exposure is likely to be fogged before development. Therefore, an image-recording layer capable of being handled in a bright room or under a yellow lump and a light source are necessary.

As such a laser light source, a semiconductor laser emitting an infrared ray having a wavelength of 760 to 1,200 and a solid laser, for example, YAG laser, are extremely useful because these lasers having a large output and a small size are inexpensively available. Also, an UV laser can be used.

Based on the background described above, adaptation of plate making operation to both simplification and digitalization has been demanded strongly more and more than ever before.

In response to such a demand, for instance, in European Patent 1,342,568, a plate making method is described in which a lithographic printing plate precursor having an image-forming layer containing hydrophobic thermoplastic polymer particles dispersed in a hydrophilic binder provided on a hydrophilic support is developed with a gum solution. According to the plate making method, the lithographic printing plate precursor is exposed imagewise using an infrared laser to fuse the hydrophobic thermoplastic polymer particles, thereby forming image and then the unexposed area is removed with the gum solution to perform development.

However, the method of developing the lithographic printing plate precursor using the image formation by heat fusion of fine particles with a single unit of the gum solution has problems in that since the fine particles in the unexposed area have good water dispersibility, the gum solution is colored and fatigued in a short time and that since the component removed with development is hardly eliminated, for example, by a filter, the component removed with development reattaches to the surface of printing plate after the development processing to cause ink stain.

In WO 05/111727, a processing method of a lithographic printing plate precursor is described in which a lithographic printing plate precursor comprising (i) a hydrophilic support and (ii) a photosensitive layer which contains a radically polymerizable ethylenically unsaturated monomer, a radical polymerization initiator and an infrared absorbing dye, is capable of being cured with infrared laser exposure and is capable of being developed with a gum solution is exposed imagewise with an infrared laser and the uncured area of the photosensitive layer is removed with a single unit of a gum solution. Also, in U.S. Pat. No. 6,902,865 and JP-A-2006-106700 (the term "JP-A" as used herein means an "unexamined published Japanese patent application") (corresponding to US2006/0046199A1), a developing method of a lithographic printing plate precursor is described in which a radical polymerization type photosensitive layer is cured with infrared laser exposure and the unexposed area is removed with an aqueous developer having pH of 2 to 10. Further, in EP-A-1,788,444, a developing method of a lithographic printing plate precursor is described in which a radical polymerization type photosensitive layer is cured with infrared laser exposure and subjected to gumming treatment with continuous two bath construction.

However, these techniques still have the problem in that the component removed with development reattaches to the surface of printing plate after the development processing to cause ink stain.

SUMMARY OF THE INVENTION

Therefore, an object of the present invention is to provide a plate making method of a lithographic printing plate precursor which can well prevent reattachment of the component removed with development to the surface of printing plate while maintaining sufficient developing property and oil-desensitizing property in a non-alkali development.

As a result of various investigations to resolve the problems described above, the inventor has found that the problems can be resolved by using a developing system having a tree bath construction of gum development-water washing-gumming treatment to complete the invention.

Specifically, the invention includes the following items.
(1) A plate making method of a lithographic printing plate precursor comprising exposing a lithographic printing plate precursor having an image-recording layer on a support and developing the exposed lithographic printing plate precursor to prepare a lithographic printing plate, wherein the developing process comprises in order (i) a process of removing an unexposed area of the image-recording layer with a gum solution, (ii) a process of washing with water and (iii) a process of oil-desensitizing a non-image area with a gum solution.
(2) The plate making method of a lithographic printing plate precursor as described in (1) above, wherein the gum solution used in the process (i) of removing an unexposed area of the image-recording layer with a gum solution and the gum solution used in the process (iii) of oil-desensitizing a non-image area with a gum solution have substantially same composition.
(3) The plate making method of a lithographic printing plate precursor as described in (1) or (2) above, wherein the water used in the process (ii) of washing with water is fresh water or reuse water circulating through a filter.
(4) The plate making method of a lithographic printing plate precursor as described in any one of (1) to (3) above, wherein the image-recording layer comprises (A) an infrared absorbing agent, (B) a polymerization initiator and (C) a polymerizable compound.
(5) The plate making method of a lithographic printing plate precursor as described in any one of (1) to (3) above, wherein the image-recording layer comprises (A) an infrared absorbing agent and (D) a hydrophobilizing precursor.
(6) The plate making method of a lithographic printing plate precursor as described in any one of (1) to (5) above, wherein the lithographic printing plate precursor has a protective layer on the image-recording layer.
(7) The plate making method of a lithographic printing plate precursor as described in (6) above, wherein the protective layer contains an inorganic stratiform compound.

According to the present invention, a plate making method of a lithographic printing plate precursor which can prevent reattachment of the component removed with development to the surface of printing plate while maintaining good developing property and oil-desensitizing property in a non-alkali development without necessity of using alkali development processing of high pH after exposure is provided so that good image reproducibility, tone reproducibility and stain resistance at the time of printing can be achieved.

DESCRIPTION OF REFERENCE NUMERALS AND SIGNS

Figure 1:
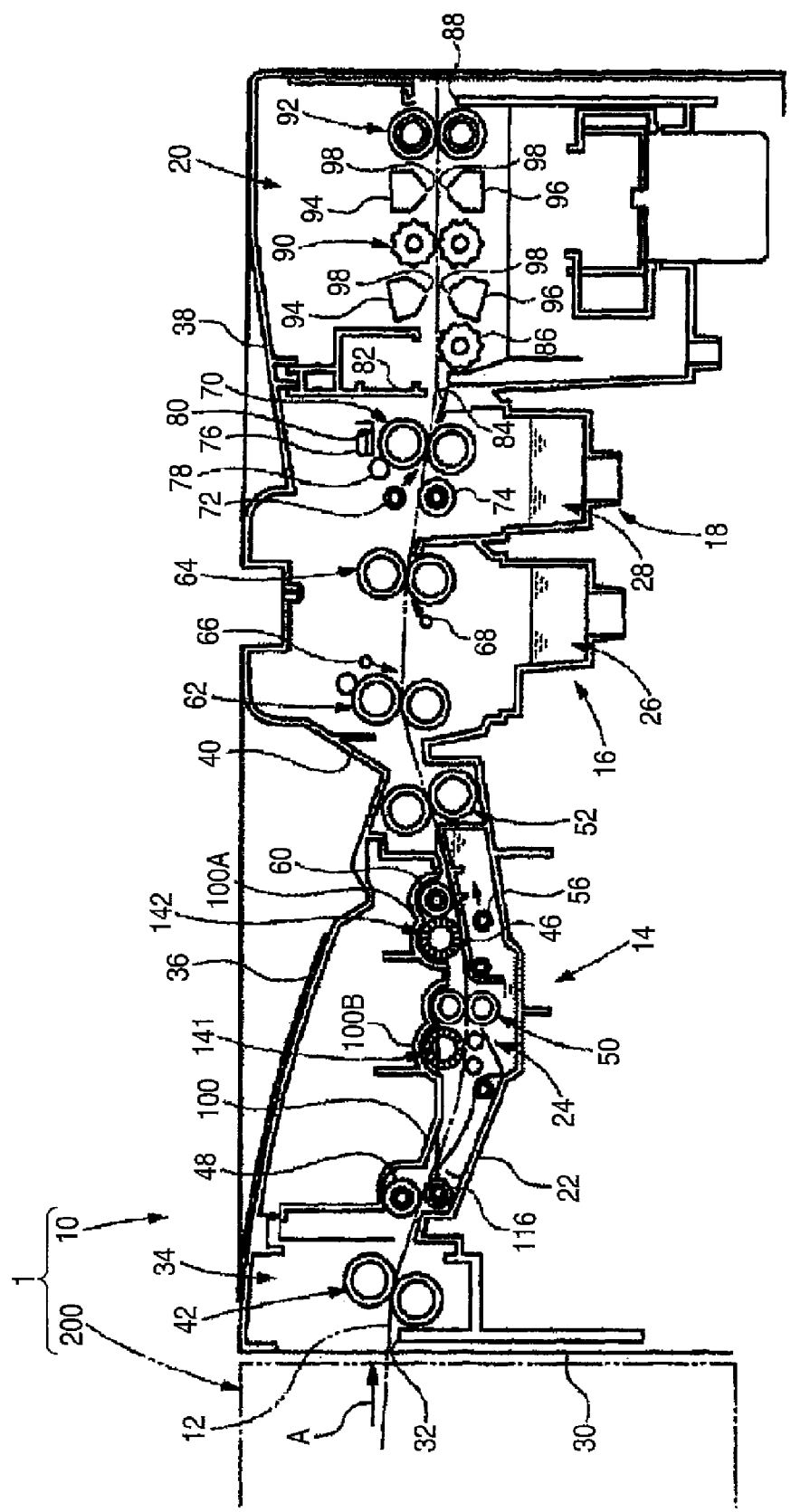
FIG. 1 is an illustration for showing a composition of an automatic development apparatus for the lithographic printing plate precursor according to the invention.

1: Automatic development apparatus
10: Development processing unit
12: Printing plate precursor
14: Developing unit
16: Water washing unit
18: Oil-desensitizing treatment unit
20: Drying unit
24: Developing bath
141,142: Brush roller (rubbing member)
200: Pre-treatment unit

DETAILED DESCRIPTION OF THE INVENTION

<Plate Making Method>

The method for preparation of a lithographic printing plate according to the invention is characterized by performing removal of an unexposed area of the image-recording layer using a gum solution after imagewise exposure.

As an oil-desensitizing agent for use in the gum solution according to the invention, gum arabic is preferably used and an aqueous solution containing from about 15 to about 20% by weight of gum arabic is used as the gum solution. Various water-soluble resins are used as the oil-desensitizing agent other than the gum arabic. For instance, dextrin, sterabic, stractan, alginic acid salt, polyacrylic acid salt, hydroxyethyl cellulose, polyvinyl pyrrolidone, polyacrylamide, methyl cellulose, hydroxypropyl cellulose, hydroxymethyl cellulose, carboxyalkyl cellulose salt and water-soluble polysaccharide extracted from soybean curd refuse are preferable, and pullulan, a derivative thereof and polyvinyl alcohol are also preferable.

Further, as a modified starch derivative, roast starch, for example, British gum, an enzymatically modified starch, for example, enzyme dextrin or Shardinger dextrin, oxidized starch, for example, solubilized starch, alphalized starch, for example, modified alphalized starch or unmodified alphalized starch, esterified starch, for example, starch phosphate, starch of fatty acid, starch sulfate, starch nitrate, starch xanthate or starch carbamate, etherified starch, for example, carboxyalkyl starch, hydroxyalkyl starch, sulfoalkyl starch, cyanoethyl starch, allyl starch, benzyl starch, carbamylethyl starch or dialkylamino starch, cross-linked starch, for example, methylol cross-linked starch, hydroxyalkyl cross-linked starch, phosphoric acid cross-linked starch or dicarboxylic acid cross-linked starch, or starch graft polymer, for example, starch-polyacrylamide copolymer, starch-polyacrylic acid copolymer, starch-polyvinyl acetate copolymer, starch-polyacrylonitrile copolymer, cationic starch-polyacrylate copolymer, cationic starch-polyvinyl copolymer, starch-polystyrene-maleic acid copolymer, starch-polyethylene oxide copolymer or starch-polypropylene copolymer is preferably used.

Also, as a natural polymer compound, starch, for example, sweet potato starch, potato starch, tapioca starch, wheat starch or corn starch, a polymer obtained from seaweed, for example, carrageenan, laminaran, seaweed mannan, funori, Irish moss, agar or sodium alginate, plant mucilage, for example, of tororoaoi, mannan, quince seed, pectin, tragacanth gum, karaya gum, xanthine gum, guar bean gum, locust bean gum, carob gum or benzoin gum, bacteria mucilage, for example, of homopolysaccharide, e.g., dextran, glucan or levan or of heteropolysaccharide, e.g., succinoglucan or xanthan gum, or protein, for example, glue, gelatin, casein or collagen is preferably used.

Two or more of the water-soluble resins may be used in combination. The water-soluble resin may be preferably contained in a range of 1 to 50% by weight, more preferably in a range of 3 to 30% by weight, in the gum solution.

The gum solution for use in the invention may contain, for example, a pH adjusting agent, a surfactant, an antiseptic agent, an antimold, an oleophilic substance, a wetting agent, a chelating agent or a defoaming agent, in addition to the oil-desensitizing agent described above.

The gum solution is advantageously used in a pH range of 3 to 12 and thus, a pH adjusting agent is ordinarily added to the gum solution. In order to adjust the pH of gum solution to 3 to 12, a mineral acid, an organic acid, an inorganic salt or the like is ordinarily added thereto. The amount thereof is from 0.01 to 2% by weight. Examples of the mineral acid include nitric acid, sulfuric acid, phosphoric acid and metaphosphoric acid. Examples of the organic acid include acetic acid, oxalic acid, malonic acid, p-toluenesulfonic acid, levulinic acid, phytic acid, an organic phosphonic acid, polystyrene sulfonic acid and an amino acid, for example, glycine, α-alanine, β-alanine. Examples of the inorganic salt include magnesium nitrate, sodium dihydrogen phosphate, disodium hydrogen phosphate, nickel sulfate, sodium hexametaphosphate or sodium tripolyphosphate. The mineral acid, organic acid, inorganic salt or the like may be used individually or in combination of two or more thereof.

Examples of the surfactant for use in the gum solution include an anionic surfactant, a cationic surfactant, an amphoteric surfactant and a nonionic surfactant. As the anionic surfactant, a fatty acid salt, an abietic acid salt, a hydroxyalkanesulfonic acid salt, an alkanesulfonic acid salt, an α-olefinsulfonic acid salt, a dialkylsulfosuccinic acid salt, an alkyldiphenyl ether disulfonaic acid salt, a straight-chain alkylbenzenesulfonic acid salt, a branched alkylbenzenesulfonic acid salt, an alkylnaphthalenesulfonic acid salt, an alkylphenoxypolyoxyethylenepropylsulfonic acid salt, a polyoxyethylene alkyl sulfophenyl ether salt, N-methyl-N-oleyltaurin sodium salt, an N-alkylsulfosuccinic monoamide disodium salt, a petroleum sulfonic acid salt, sulfated caster oil, sulfated beef-tallow oil, a sulfuric eater salt of fatty acid alkyl ester, an alkylsulfuric acid ester salt, a polyoxyethylene alkyl ether sulfuric acid ester salt, a fatty acid monoglyceride sulfuric acid ester salt, a polyoxyethylene alkyl phenyl ether sulfuric acid ester salt, a polyoxyethylene styryl phenyl ether sulfuric acid ester salt, an alkylphosphoric acid ester salt, a polyoxyethylene alkyl ether phosphoric acid ester salt, a polyoxyethylene alkyl phenyl ether phosphoric acid ester salt, a partially saponified styrene/maleic anhydride copolymer, a partially saponified olefin/maleic anhydride copolymer and a formaldehyde condensate of naphthalenesulfonic acid salt are exemplified. Among them, a dialkylsulfosuccinic acid salt, an alkylsulfuric acid ester salt, an alkylnaphthalenesulfonic acid salt, an α-olefinsulfonic acid salt and an alkyldiphenyl ether disulfonaic acid salt are particularly preferably used.

As the cationic surfactant, an alkylamine salt and a quaternary ammonium salt are used.

As the amphoteric surfactant, an alkylcarboxy betaine, an alkylimidazoline and an alkylaminocarboxylic acid are used.

As the nonionic surfactant, a polyoxyethylene alkyl ether, a polyoxyethylene alkyl phenyl ether, a polyoxyethylene polystyryl phenyl ether, a polyoxyethylene polyoxypropylene alkyl ether, a glycerin fatty acid partial ester, a sorbitan fatty acid partial ester, a pentaerythritol fatty acid partial ester, a propylene glycol monofatty acid ester, a sucrose fatty acid partial ester, a polyoxyethylenesorbitan fatty acid partial esters, polyoxyethylenesorbitol fatty acid partial ester, a polyethylene glycol fatty acid ester, a polyglycerin fatty acid partial ester, a polyoxyethylenized castor oil, a polyoxyethyleneglycerin fatty acid partial ester, a fatty acid diethanolamide, an N,N-bis-2-hydroxyalkylamine, a polyoxyethylene alkylamine, a triethanolamine fatty acid ester, a trialkylamine oxide, polypropylene glycol having molecular weight of 200 to 5,000, trimethylol propane, a polyoxyethylene or polyoxypropylene adduct of glycerine or sorbitol and acetylene glycol are exemplified. Further, a nonionic fluorine-based or silicon-based surfactant is also used.

Two or more of the surfactants may be used in combination. The amount of the surfactant used is not particularly restricted and is preferably from 0.01 to 20% by weight, more preferably from 0.05 to 10% by weight, based on the total weight of the gum solution.

As the antiseptic agent, known antiseptic agents used in the fields, for example, of fiber, wood processing, food, medicine, cosmetic and agriculture can be employed. Known antiseptic agents, for example, a quaternary ammonium salt, a monovalent phenol derivative, a divalent phenol derivative, a polyvalent phenol derivative, an imidazole derivative, a pyrazolopyrimidine derivative, a monovalent naphthol, a carbonate, a sulfone derivative, an organic tin compound, a cyclopentane derivative, a phenyl derivative, a phenol ether derivative, a phenol ester derivative, a hydroxylamine derivative, a nitrile derivative, a naphthaline, a pyrrole derivative, a quinoline derivative, a benzothiazole derivative, a secondary amine, a 1,3,5-triazine derivative, a thiadiazole derivative, an anilide derivative, a pyrrole derivative, a halogen derivative, a dihydric alcohol derivative, a dithiol, a cyanic acid derivative, a thiocarbamide derivative, a diamine derivative, an isothiazole derivative, a monohydric alcohol, a saturated aldehyde, an unsaturated monocarboxylic acid, a saturated ether, an unsaturated ether, a lactone, an amino acid derivative, hydantoin, a cyanuric acid derivative, a guanidine derivative, a pyridine derivative, a saturated monocarboxylic acid, a benzenecarboxylic acid derivative, a hydroxycarboxylic acid derivative, biphenyl, a hydroxamic acid derivative, an aromatic alcohol, a halogenophenol derivative, a benzenecarboxylic acid derivative, a mercaptocarboxylic acid derivative, a quaternary ammonium salt derivative, a triphenylmethane derivative, hinokitiol, a furan derivative, a benzofuran derivative, an acridine derivative, an isoquinoline derivative, an arsine derivative, a thiocarbamic acid derivative, a phosphoric acid ester, a halogenobenzene derivative, a quinone derivative, a benzenesulfonic acid derivative, a monoamine derivative, an organic phosphoric acid ester, a piperazine derivative, a phenazine derivative, a pyrimidine derivative, a thiophanate derivative, an imidazoline derivative, an isoxazole derivative or an ammonium salt derivative can be used. Particularly preferable examples of the antiseptic agent include salt of pyridinethiol-1-oxide, salicylic acid and a salt thereof, 1,3,5-trishydroxyethylhexahydro-S-triazine, 1,3,5-trishydroxymethylhexahydro-S-triazine, 1,2-benzisothiazolin-3-one, 5-chloro-2-methyl-4-isothiazolin-3-one and 2-bromo-2-nitro-1,3-propanediol. The amount of the antiseptic agent preferably added is determined so as for the antiseptic agent to work in a stable and effective manner against a bacterium, mold, yeast or the like, and it is preferably from 0.01 to 4% by weight based on the gum solution at the use while it may be varied depending on the kind of bacterium, mold, yeast or the like. It is also preferred to use two or more kinds of antiseptic agents in order to effectively work against various kinds of molds and bacteria.

Into the gum solution, the oleophilic substance may be incorporated. Preferable examples of the oleophilic substance include an organic carboxylic acid having from 5 to 25 carbon atoms, for example, oleic acid, lanolic acid, valeric acid, nonylic acid, capric acid, myristic acid or palmitic acid and castor oil. The oleophilic substances may be used individually or in combination of two or more thereof. The content of the oleophilic substance in the gum solution is preferably in a range from 0.005 to 10% by weight, more preferably from 0.05 to 5% by weight, based on the total weight of the gum solution.

Further, to the gum solution may be added as the wetting agent, glycerin, ethylene glycol, propylene glycol, triethylene glycol, butylenes glycol, hexylene glycol, diethylene glycol, dipropylene glycol, glycerin, trimethylol propane, diglycerin or polyoxyethylene, if desired. The wetting agents may be used individually or in combination of two or more thereof. The wetting agent is preferably used in an amount of 0.1 to 5% by weight.

Moreover, the chelating compound may be added to the gum solution. The gum solution is ordinarily marketed as a concentrated solution and is diluted by addition of tap water, well water or the like to use. Calcium ion or the like included in the tap water or well water used for the dilution adversely affects printing and may be apt to cause stain on the printed material. In such a case, the problem can be solved by adding the chelating compound. Preferable examples of the chelating compound include ethylenediaminetetraacetic acid, potassium salt thereof, sodium salt thereof, diethylenetriaminepentaacetic acid, potassium salt thereof, sodium salt thereof, triethylenetetraminehexaacetic acid, potassium salt thereof, sodium salt thereof, hydroxyethylethylenediaminetriacetic acid, potassium salt thereof, sodium salt thereof, nitrilotriacetic acid or sodium salt thereof, and an organic phosphonic acid or a phosphonoalkane tricarboxylic acid, e.g., 1-hydroxyethane-1,1-diphosphonic acid, potassium salt thereof, sodium salt thereof, aminotri(methylenephosphonic acid), potassium salt thereof or sodium salt thereof. An organic amine salt is also effectively used in place of the sodium salt or potassium salt of the above-described chelating compound. The chelating compound which is stably present in the gum solution and does not disturb printing is preferably used. The amount of the chelating compound added is suitably from 0.001 to 1.0% by weight of the gum solution at the use.

Furthermore, to the gum solution may be added the defoaming agent. Particularly, a silicon defoaming agent is preferably used. Any silicone defoaming agent of emulsion dispersion type and solubilization type can be used. The amount of the defoaming agent added is optimally in a range of 0.001 to 1.0% by weight of the gum solution at the use.

The gum solution may also be prepared as an emulsion dispersion type. In the gum solution of emulsion dispersion type, an organic solvent is used as the oil phase thereof. Also, the gum solution may be in the form of solubilization type (emulsification type) by the aid of the surfactant as described above.

The organic solvent preferably has solubility of 5% by weight or less in water at 20° C. and a boiling point of 160° C. or more. The organic solvent includes a plasticizer having a solidification point of 15° C. or less and a boiling point of 300° C. or more under 1 atmospheric pressure, for instance, a phthalic acid diester, for example, dibutyl phthalate, diheptyl phthalate, di-n-octyl phthalate, di-(2-ethylhexyl)phthalate, dinonyl phthalate, didecyl phthalate, dilauryl phthalate or butyl benzyl phthalate, an aliphatic dibasic acid ester, for example, dioctyl adipate, butyl glycol adipate, dioctyl azelate, dibutyl sebacate, di-(2-ethylhexyl)sebacate or dioctyl sebacate, an epoxidized triglyceride, for example, epoxidized soybean oil, a phosphate, for example, tricresyl phosphate, trioctyl phosphate or trischloroethyl phosphate and a benzoates, for example, benzyl benzoate.

Also, as an alcohol type organic solvent, 2-octanol, 2-ethylhexanol, nonanol, n-decanol, undecanol, n-dodecanol, trimethylnonyl alcohol, tetradecanol and benzyl alcohol are exemplified. As a glycol type organic solvent, ethylene glycol isoamyl ether, ethylene glycol monophenyl ether, ethylene glycol benzyl ether, ethylene glycol hexyl ether and octylene glycol are exemplified.

In selecting the compound, particularly, odor is taken account of. The amount of the organic solvent used is preferably from 0.1 to 5% by weight, more preferably from 0.5 to 3% by weight, based on the gum solution. The organic solvents may be used individually or in combination of two or more thereof.

As the gum solution for use in the invention, a gum solution described, for example, in EP 1,342,568B1 and EP 1,788,444A1 is also preferably used.

The gum solution for use in the invention is produced by preparing an aqueous phase while controlling the temperature of 40° C.±5° C. with stirring at a high speed, gradually adding dropwise an oil phase prepared to the aqueous phase, thoroughly stirring and emulsifying and dispersing by passing through a homogenizer of pressure type.

The reminder of the gum solution is water. It is advantageous in view of transportation that the gum solution is stored in the form of a concentrated solution in which the content of water is reduced in comparison with the time of use and the concentrated solution is diluted with water at the use. In such a case, the concentration degree is suitably in a level that each component of the gum solution does not cause separation or deposition.

The method for preparation of a lithographic printing plate according to the invention is also characterized in that the process of removing the non-image area of the image-recording layer with a gum solution is followed by performing a process of washing with water and a subsequent process of oil-desensitizing the non-image area with a gum solution.

Unlike in the case of a single treatment with a gum solution or a two stage treatment of gum solution/gum solution, the removed component of the unexposed area of the image-recording layer reattached to the surface of printing plate can be completely removed by performing washing with water after the process of removing the unexposed area of the image-recording layer using a gum solution according to the invention.

As the water for use in the process of washing with water according to the invention, any water, for example, ordinary tap water, well water, ion-exchanged water or distilled water may be used and tap water or well water is preferably used from the economical standpoint. Also, to reuse the water once used in the process of washing with water as it is not preferable in view of the reattachment of the unexposed area of the image-recording layer and it is preferred to use fresh water at any time or to reuse the water used in the process of washing with water after circulation through a filter.

As the filter for use in the invention, any filter may be used as long as it can filter the removed component of the image-recording layer mixed in a water washing unit. As a material of the filter, for example, a polyester resin, a polypropylene resin, a polyethylene resin a cellulose resin or cotton is preferably used. With respect to the configuration thereof, a structure in which a filter is held in the form of a cartridge in a housing as a replaceable filter is preferable. As the cartridge, a pleated type prepared by processing a filter paper made of a cellulose fiber with an epoxy resin in order to reinforce and prevent detachment of the fiber and casting in the form of pleats in order to increase a filtration area, a depth type prepared by winding up a yarn comprising many fibers (fiber bundle) from a central tube so as to form a gradual density gradient, or an adsorbing type prepared by housing an adsorbent in a case made of plastic, for example, polyethylene or prepared by supporting an adsorbent, for example, active carbon on media mainly composed of a resin, cellulose, a glass fiber and a water-absorbing polymer is preferably used. As the adsorbent, silica gel, active carbon, active aluminum, molecular sieve, clay and a material selected from superabsorbent fiber, calcium carbonate, calcium sulfate, potassium permanganate, sodium carbonate, potassium carbonate, sodium phosphate and active metal and ion exchanger used in various filters are used.

As a commercially available filter, a cartridge filter "TCW Type", "TCP Type" or "TCS Type" produced by Advantec Mfs, Inc. is preferably used.

A mesh diameter of the filter is preferably from 5 to 500 μm, more preferably from 10 to 200 μm, still more preferably from 20 to 100 μm.

The gum component supplied on the surface of printing plate precursor in the process of removing the unexposed area of the image-recording layer is mostly removed by the process of washing with water. Especially, in the case of the lithographic printing plate precursor for use in the invention, unlikely an alkali-soluble image-recording layer, since the image-recording layer is removable in the unexposed area with the gum solution and the surface of the support or the undercoat layer described hereinafter is designed to be highly hydrophilic, the gum component is easily removed by the process of washing with water. According to the invention, therefore, subsequent to the process of washing with water, the next process of oil-desensitizing with a gum solution is performed.

By supplying again a gum solution to the surface of printing plate after the process of washing with water, the non-image area can be sufficiently oil-desensitized. In the process of oil-desensitizing, the gum solution described above can be appropriately used. In view of the effect of oil-desensitization, it is preferred in the process to use a gum solution having the substantially same composition as the gum solution used in the process of removing the unexposed area of the image-recording layer. This means that the gum solution stocked in a tank for the process of removing and the gum solution stocked in a tank for the process of oil-desensitizing are the same solution and includes that the composition rate may change according to the subsequent processing. Specifically, since the gum solution contains various compounds as described above, when different gum solutions are used in the process of removing the unexposed area of the image-recording layer and the process of oil-desensitizing the non-image area, there is a possibility that the gum component used in the process of removing which is not removed in the process of washing with water may disturb the expression of oil-desensitizing effect of the gum component used in the process of oil-desensitizing.

The development processing according to the invention can be preferably carried out by an automatic processor equipped with a supplying means for the gum solution and a rubbing member. As the automatic processor, there is illustrated, for instance, an automatic processor in which a lithographic printing plate precursor after image recording is subjected to a rubbing treatment while it is transporting described, for example, in JP-A-2006-235227. Particularly, an automatic processor using a rotating brush roll as the rubbing member is preferred.

The rotating brush roller which can be preferably used in the invention can be appropriately selected by taking account, for example, of scratch resistance of the image area and nerve strength of a support of the lithographic printing plate precursor.

As for the rotating brush roller, a known rotating brush roller produced by implanting a brush material in a plastic or metal roller can be used. For example, a rotating brush roller described in JP-A-58-159533 and JP-A-3-100554, or a brush roller described in JP-UM-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl(meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

The rotary direction of the rotating brush roller for use in the invention may be the same direction or the opposite direction with respect to the transporting direction of the lithographic printing plate precursor according to the invention, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the image-recording layer in the non-image area can be more steadily removed. Further, a technique of rocking the rotating brush roller in the rotation axis direction of the brush roller is also effective.

The gum solution in the process of removing the image-recording layer, water in the process of washing with water and gum solution in the process of oil-desensitizing can be independently used at appropriate temperature, and they are preferably used in a temperature range of 10 to 50° C.

In the invention, it is optionally possible to provide a drying process between the process of washing with water and the process of oil-desensitizing and/or after the process of oil-desensitizing. The drying process is ordinarily carried out by blowing dry wind of appropriate temperature after removing most of the processing solution by a roller nip.

In advance of the above-described development processing, the lithographic printing plate precursor is imagewise exposed through a transparent original having a line image, a halftone dot image or the like, or imagewise exposed, for example, by scanning of laser beam based on digital data. As a light source preferable for the image exposure, a carbon arc lamp, a mercury lamp, a xenon lamp, a metal halide lamp, a strobe, an ultraviolet ray, an infrared ray or a laser beam is exemplified. The laser beam is particularly preferable and includes a solid laser or semiconductor laser emitting an infrared ray having a wavelength of 760 to 1,200 nm, an ultraviolet semiconductor laser emitting light having a wavelength of 250 to 420 and an argon ion laser or an FD-YAG laser emitting visible light. Among them, from the standpoint of simplification of the plate making, a laser emitting an infrared ray which enables the work under a white lamp or a yellow lamp is preferable.

With respect to the infrared laser, the output is preferably 100 mW or more, the exposure time per pixel is preferably within 20 microseconds, and the irradiation energy is preferably from 10 to 300 mJ/cm$^2$. In order to shorten the exposure time, it is preferred to use a multibeam laser device.

The constituent elements and components of the lithographic printing plate precursor for use in the invention will be described below.

<Lithographic Printing Plate Precursor>

The lithographic printing plate precursor for use in the invention comprises an image-recording layer and preferably a protective layer provided in order on a support and the image-recording layer is an image-recording layer capable of forming an image by removing the unexposed area with supplying the gum solution described above after the imagewise exposure. The terminology "provided in order" as used herein means that the imagerecording layer and preferably the protective layer are provided in order on the support and does not exclude the presence of an optional layer, for example, an undercoat layer, an intermediate layer or a backcoat layer.

(Image-Recording Layer)

The representative image formation mechanism of the image-recording layer includes [1] an embodiment wherein the image-recording layer contains (A) an infrared absorbing agent, (B) a polymerization initiator and (C) a polymerizable compound and the exposed area thereof is polymerized and cured to from an image area and [2] an embodiment wherein the image-recording layer contains (A) an infrared absorbing agent and (D) a hydrophobilizing precursor and the hydrophobilizing precursors are fused to each other with heat or a reaction in the exposed area to from a hydrophobic area (image area). Into the image-recording layer of polymerization type [1], the hydrophobilizing precursor (D) may further be incorporated. Moreover, various components may be added to these image-recording layers depending on purposes. The constituting components of the image-recording layer according to the invention will be described below.

<(A) Infrared Absorbing Agent>

The lithographic printing plate precursor according to the invention can form an image using as a light source, an infrared ray, for example, a laser emitting an infrared ray of 760 to 1,200 nm by incorporating the infrared absorbing agent (A) therein.

The infrared absorbing agent has a function of converting the infrared ray absorbed to heat and a function of being excited by the infrared ray to perform electron transfer/energy transfer to a polymerization initiator (radical generator) described hereinafter. The infrared absorbing agent for use in the invention includes a dye and pigment each having an absorption maximum in a wavelength range of 760 to 1,200 nm.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thiopyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 (the term "JP-B" as used herein means an "examined Japanese patent publication") and JP-B-5-19702 are also preferably used. Other preferable examples of the dye include near infrared absorbing dyes represented by formulae (I) and (II) in U.S. Pat. No. 4,756,993.

Other preferable examples of the infrared absorbing dye according to the invention include specific indolenine cyanine dyes described in JP-A-2002-278057 as illustrated below.

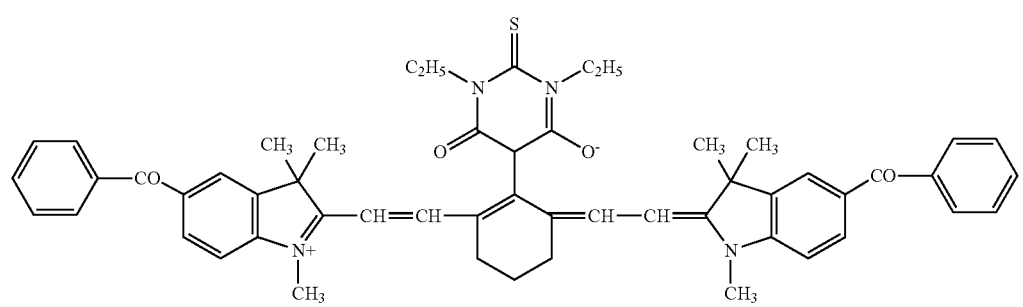

-continued

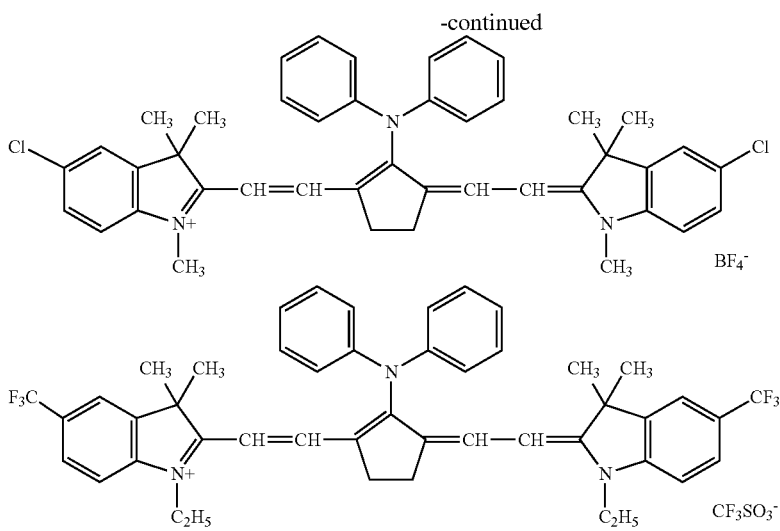

Of the dyes, cyanine dyes, squarylium dyes, pyrylium dyes, nickel thiolate complexes and indolenine cyanine dyes are preferred. Further, cyanine dyes and indolenine cyanine dyes are more preferred. As a particularly preferable example of the dye, a cyanine dye represented by formula (i) shown below is exemplified.

Formula (i):

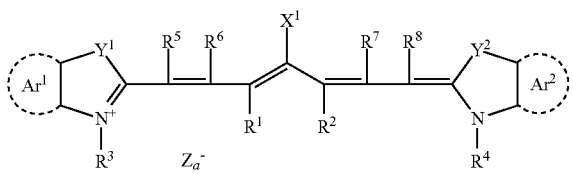

In formula (i), $X^1$ represents a hydrogen atom, a halogen atom, —$NPh_2$, $X^2$-$L^1$ or a group represented by the structural formula shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom used herein indicates a nitrogen atom, a sulfur atom, an oxygen atom, a halogen atom or a selenium atom. $R^a$ represents a substituent selected from a hydrogen atom, an alkyl group, an aryl group, a substituted or unsubstituted amino group and a halogen atom, and $Xa^-$ has the same meaning as $Za^-$ defined hereinafter.

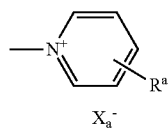

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms, and a hydrocarbon group having 12 or less carbon atoms and an alkoxy group having 12 or less carbon atoms are most preferable. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group, and an alkoxy group having 12 or less carbon atoms is most preferable. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (i) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-recording layer.

Specific examples of the cyanine dye represented by formula (i), which can be preferably used in the invention, include those described in paragraph Nos. [0017] to [0019] of JP-A2001-133969.

Further, other particularly preferable examples include specific indolenine cyanine dyes described in JP-A-2002-278057 described above.

Examples of the pigment for use in the invention include commercially available pigments and pigments described in Colour Index (C.I.), Saishin Ganro Binran (Handbook of the Newest Pigments) compiled by Pigment Technology Society of Japan (1977), Saishin Ganryo Oyou Gijutsu (Newest Application on Technologies for Pigments), CMC Publishing Co., Ltd. (1986) and *Insatsu Ink Gijutsu* (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application on Technologies for Pigments), CMC Publishing Co., Ltd. (1986).

The pigment has a particle size of preferably from 0.01 to 10 µm, more preferably from 0.05 to 1 µm, particularly preferably from 0.1 to 1 µm. In the range described above, good stability of the pigment dispersion in the coating solution for image-recording layer and good uniformity of the image-recording layer can be obtained.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu* (Newest Application on Technologies for Pigments), CMC Publishing Co., Ltd. (1986).

The infrared absorbing agent may be added together with other components to the same image-recording layer or may be added to a different image-recording layer separately provided. With respect to the amount of the infrared absorbing agent added, in the case of preparing a lithographic printing plate precursor, the amount is so controlled that absorbance of the image-recording layer at the maximum absorption wavelength in the wavelength region of 760 to 1,200 nm measured by reflection measurement is in a range of 0.3 to 1.2, preferably in a range of 0.4 to 1.1. In the range described above, the polymerization reaction proceeds uniformly in the thickness direction of the image-recording layer and good film strength of the image area and good adhesion property of the image area to the support are achieved.

The absorbance of the image-recording layer can be controlled depending on the amount of the infrared absorbing agent added to the image-recording layer and the thickness of the image-recording layer. The measurement of the absorbance can be carried out in a conventional manner. The method for measurement includes, for example, a method of forming an image-recording layer having a thickness determined appropriately in the range necessary for the lithographic printing plate precursor on a reflective support, for example, an aluminum plate, and measuring reflection density of the image-recording layer by an optical densitometer or a spectrophotometer according to a reflection method using an integrating sphere.

With respect to the specific amount of the infrared absorbing agent (A) added, the content of the infrared absorbing agent (A) in the image-recording layer according to the invention is preferably from 0.1 to 10.0% by weight, more preferably from 0.5 to 5.0% by weight, based on the total solid content of the image-recording layer.

<(B) Polymerization Initiator>

The polymerization initiator (B) for use in the invention is a compound that generates a radical with light energy, heat energy or both energies to initiate or accelerate polymerization of a polymerizable compound (C). The polymerization initiator for use in the invention includes, for example, known thermal polymerization initiators, compounds containing a bond having small bond dissociation energy and photopolymerization initiators.

The polymerization initiators according to the invention include, for example, (a) organic halides, (b) carbonyl compounds, (c) azo compounds, (d) organic peroxides, (e) metallocene compounds, (f) azido compounds, (g) hexaarylbiimidazole compounds, (h) organic borate compounds, (i) disulfone compounds, (j) oxime ester compounds and (k) onium salt compounds.

The organic halides (a) specifically include, for example, compounds described in Wakabayashi et al., *Bull. Chem. Soc. Japan,* 42, 2924 (1969), U.S. Pat. No. 3,905,815, JP-B-46-4605, JP-A-48-35281, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry,* 1, No. 3 (1970). Particularly, oxazole compounds and s-triazine compounds each substituted with a trihalomethyl group are preferably exemplified.

More preferably, s-triazine derivatives and oxadiazole derivatives each of which has at least one of mono-, di- and tri-halogen substituted methyl groups connected are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluoromethylphenyl)-4,6-bis(trichloromethyl)-s-triazine, 2-(2,6-dichlorophenyl)-4,6-bis(trichloromethyl)-s-triazine, 2-(2,6-difluorophenyl)-4,6-bis(trichloromethyl)-s-triazine, 2-(2,6-dibromophenyl)-4,6-bis(trichloromethyl)-s-triazine, 2-(4-biphenylyl)-4,6-bis(trichloromethyl)-s-triazine, 2-(4'-chloro-4-biphenylyl)-4,6-bis(trichloromethyl)-s-triazine, 2-(p-cyanophenyl)-4,6-bis(trichloromethyl)-s-thiazine, 2-(p-acetylphenyl)-4,6-bis(trichloromethyl)-s-triazine, 2-(p-ethoxycarbonylphenyl)-4,6-bis(trichloromethyl)-s-triazine, 2-(p-phenoxyvarbonylphenyl)-4,6-bis(trichloromethyl)-s-triazine, 2-(p-methylsulfonylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6- bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, 2-(o-methoxystyryl)-5-trichloromethyl-1,3,4-oxadiazole, 2-(3,4-epoxystyryl)-5-trichloromethyl-1,3,4-oxadiazole, 2-[1-phenyl-2-(4-methoxyphenyl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole and 2-(p-tert-butoxystyryl)-5-trichloromethyl-1,3,4-oxadiazole.

The carbonyl compounds (b) include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl) ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds (c) include, for example, azo compounds described in JP-A-8-108621.

The organic peroxides (d) include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds (e) include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyelopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl or dicyclopentadienyl-Ti-bis-2,6-difluoro-3-(pyrol-1-yl)phen-1-yl, and iron-arene complexes described in JP-A-1-304453 and JP-A-1-152109.

The azido compounds (f) include, for example, 2,6-bis(4-azidobenzylidene)-4-methylcyclohexanone.

The hexaarylbiimidazole compounds (g) include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole or 2,2'-bis(o-trifluoromethylphenyl)-4,4',5,5'-tetraphenylbiimidazole.

The organic borate compounds (h) include, for example, organic berates described in JP-A-62-143044, JP-A-62-150242, JP-A-9-188685, JP-A-9-188686, JP-A-9-188710, JP-A-2000-131837, JP-A-2002-107916, Japanese Patent 2,764,769, JP-A-2002-116539 and Martin Kunz, *Rad Tech '98, Proceeding*, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds (i) include, for example, compounds described in JP-A-61-166544 and JP-A-2002-328465.

The oxime ester compounds (j) include, for example, compounds described in *J. C. S. Perkin II*, 1653-1660 (1979), *J. C. S. Perkin II*, 156-162 (1979), *Journal of Photopolymer Science and Technology*, 202-232 (1995) and JP-A-2000-66385, and compounds described in JP-A-2000-80068. Specific examples thereof include compounds represented by the following structural formulae:

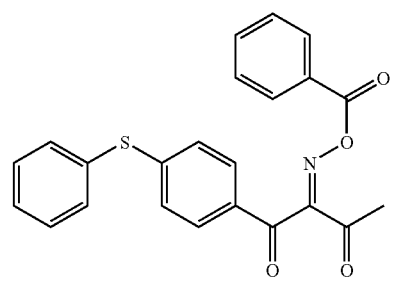

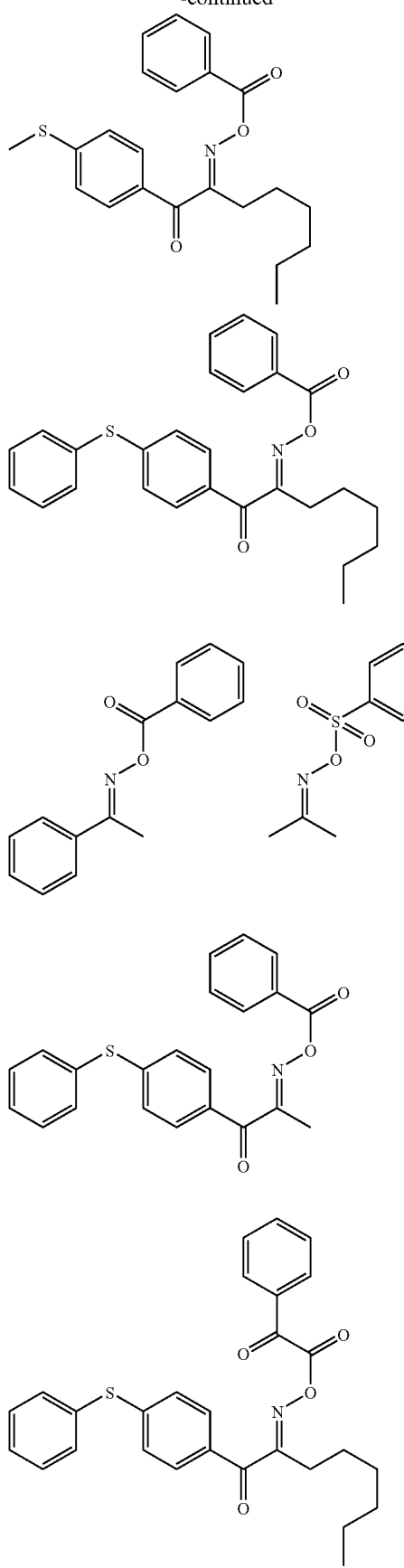
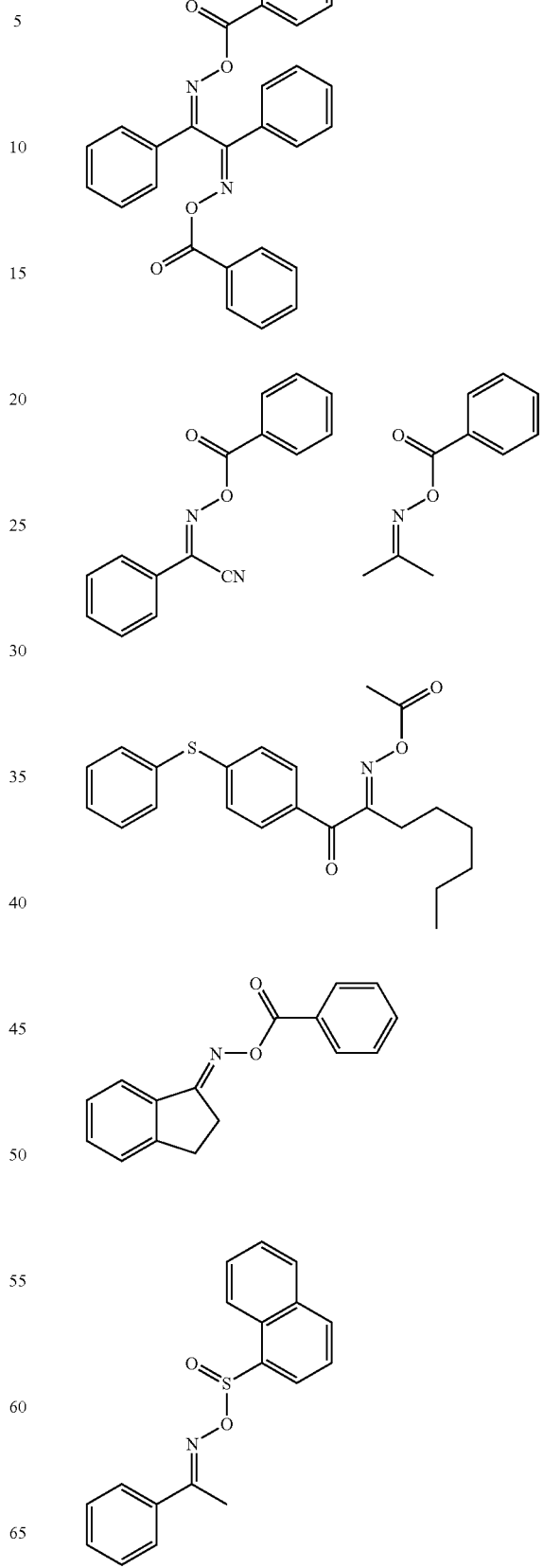

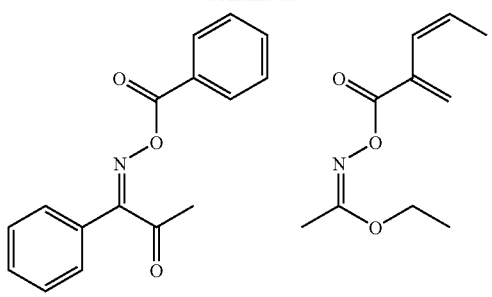
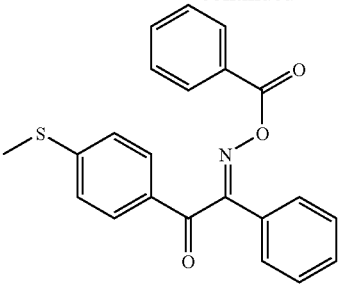
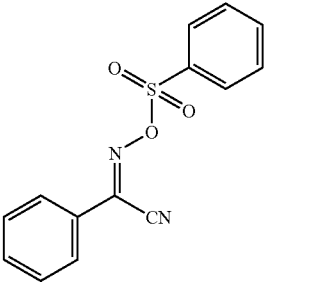
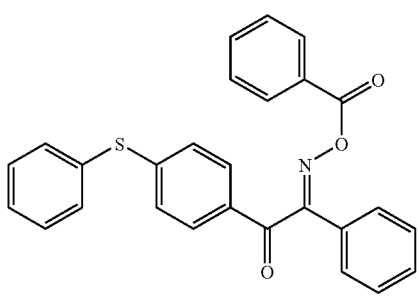
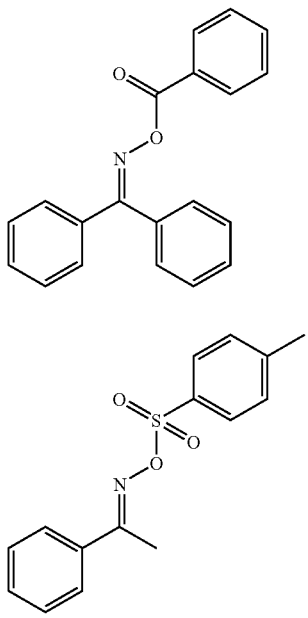
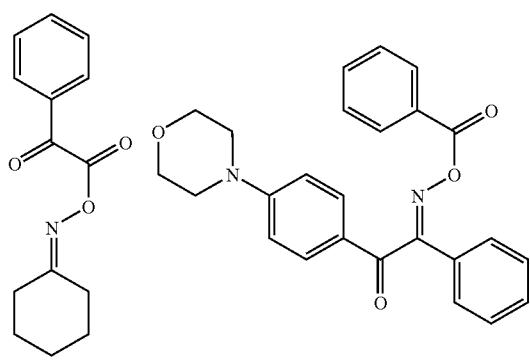

The onium salt compounds (k) include, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), and arsonium salts described in C. S. Wen et al., *Teh, Proc. Conf. Rad. Curing ASIA*, p. 478, Tokyo, October (1988).

Particularly, in view of reactivity and stability, the oxime ester compounds and diazonium salts, iodonium salts and sulfonium salts described above are preferably exemplified. In the invention, the onium salt functions not as an acid generator but as an ionic radical polymerization initiator.

The onium salts preferably used in the invention include onium salts represented by the following formulae (RI-I) to (RI-III):

$$Ar^{11}-N^+\equiv N \qquad (RI\text{-}I)$$
$$Z^{11-}$$

$$Ar^{21}-I^+-Ar^{22} \qquad (RI\text{-}II)$$
$$Z^{21-}$$

$$\begin{matrix} R^{31} \\ | \\ R^{33}-S^+-R^{32} \end{matrix} \quad Z^{31-} \qquad (RI\text{-}III)$$

In formula (RI-I), $Ar^{11}$ represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{11-}$ represents a monovalent anion and specifically includes a halogen ion, a perchlorate ion, a hexafluorophosphate ion, a tetrafluoroborate ion, a sulfonate ion, a sulfinate ion, a thosulfonate ion and a sulfate ion. From the standpoint of stability and visibility of print-out image, a perchlorate ion, a hexafluorophosphate ion, a tetrafluoroborate ion, a sulfonate ion or a sulfinate ion is preferable.

In the formula (RI-II), $Ar^{21}$ and $Ar^{22}$ each independently represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{21-}$ represents a monovalent anion and specifically includes a halogen ion, a perchlorate ion, a hexafluorophosphate ion, a tetrafluoroborate ion, a sulfonate ion, a sulfinate ion, a thosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable.

In the formula (RI-III), $R^{31}$, $R^{32}$ and $R^{33}$ each independently represents an aryl group having 20 or less carbon atoms, which may have 1 to 6 substituents, an alkyl group, an alkenyl group or an alkynyl group and is preferably an aryl group from the standpoint of reactivity and stability. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{31-}$ represents a monovalent anion and specifically includes a halogen ion, a perchlorate ion, a hexafluorophosphate ion, a tetrafluoroborate ion, a sulfonate ion, a sulfinate ion, a thosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable. Carboxylate ions described in JP-A-2001-343742 are more preferable, and carboxylate ions described in JP-A-2002-148790 are particularly preferable.

Specific examples of the onium salt compound preferably used as the polymerization initiator in the invention are set forth below, but the invention should not be construed as being limited thereto.

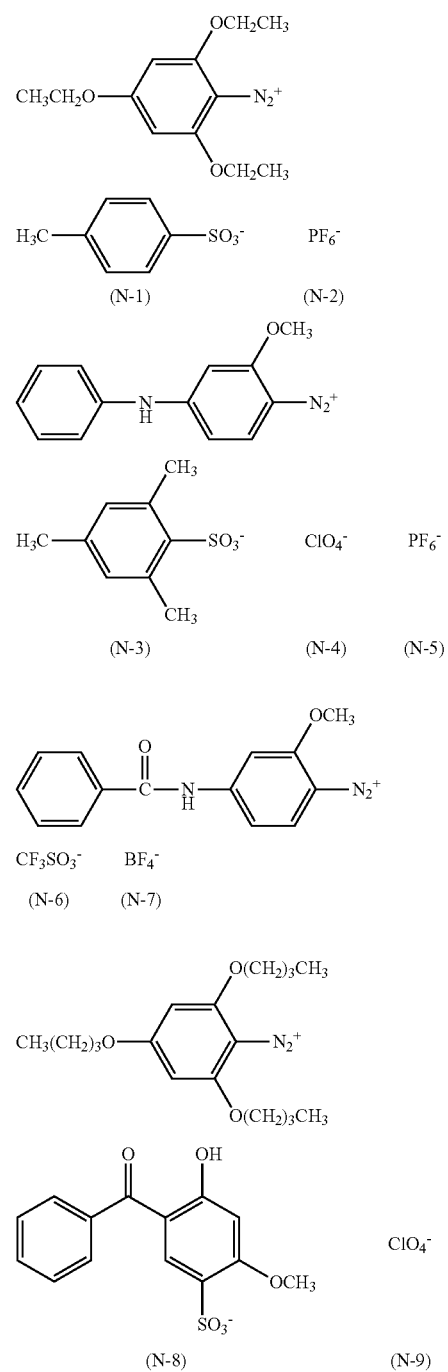

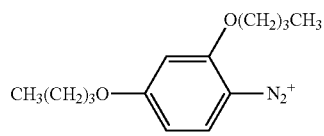
(N-10)   (N-11)   (N-12)
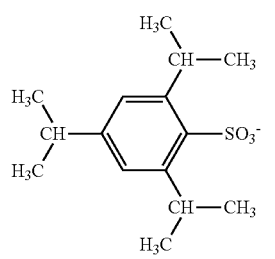
(N-13)   (N-14)
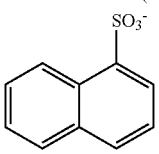 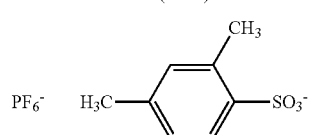
(N-15)   (N-16)   (N-17)
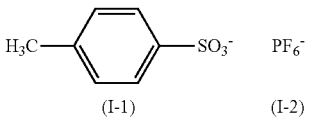
(I-1)   (I-2)
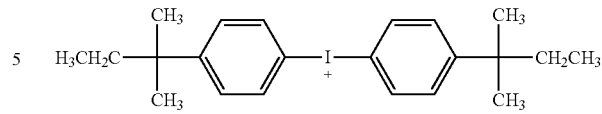
(I-3)   (I-4)   (I-5)
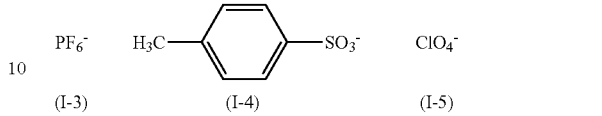
(I-6)   (I-7)   (I-8)
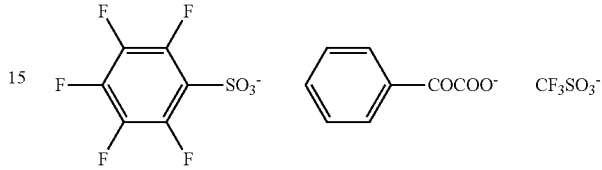
(I-9)   (I-10)
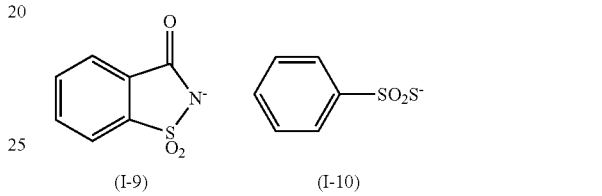
(I-11)   (I-12)
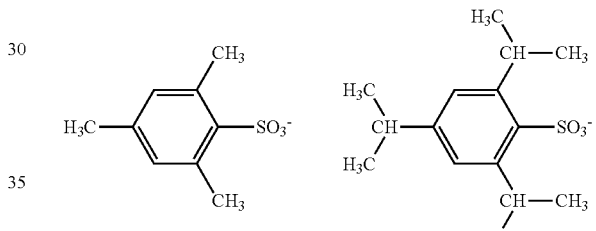
(I-13)   (I-14)   (I-15)
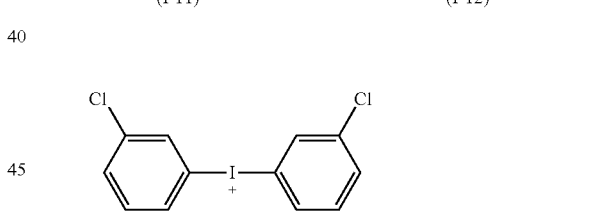
(I-16)   (I-17)   (I-18)   (I-19)

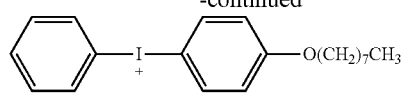
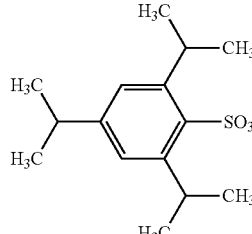
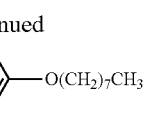
(I-20)  (I-21)  (I-22)
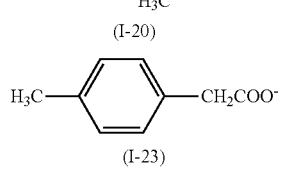
(I-23)
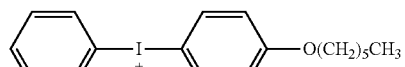
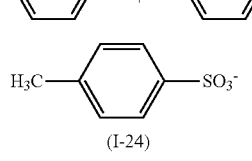
(I-24)
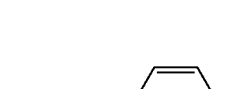
(I-25)
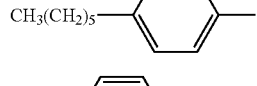
(I-26)
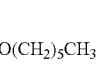
(I-27)
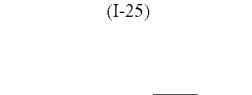
(I-28)  (I-29)
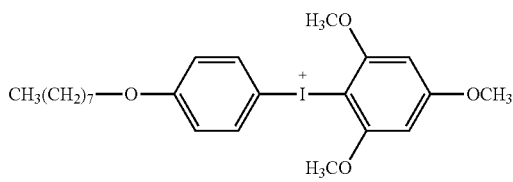
(I-30)  (I-31)  (I-32)
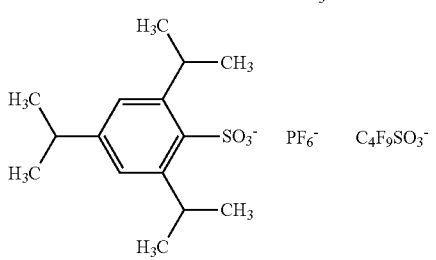
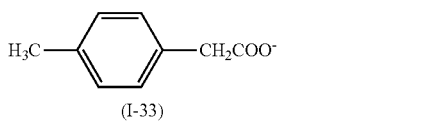
(I-33)
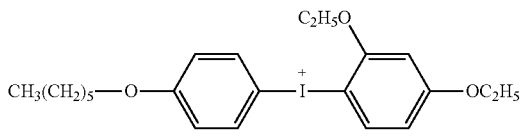
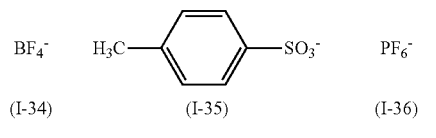
(I-34)  (I-35)  (I-36)
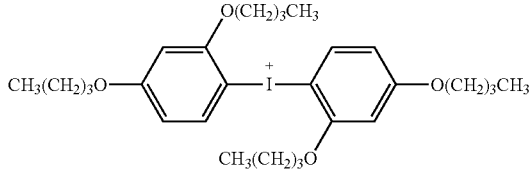
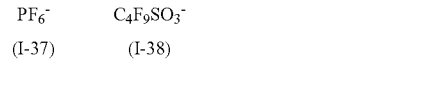
(I-37)  (I-38)
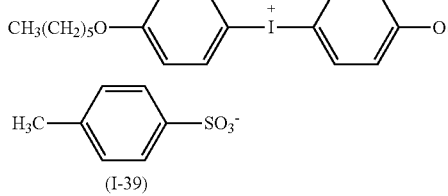
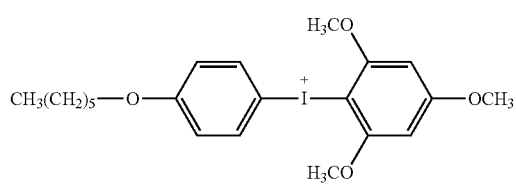
(I-39)

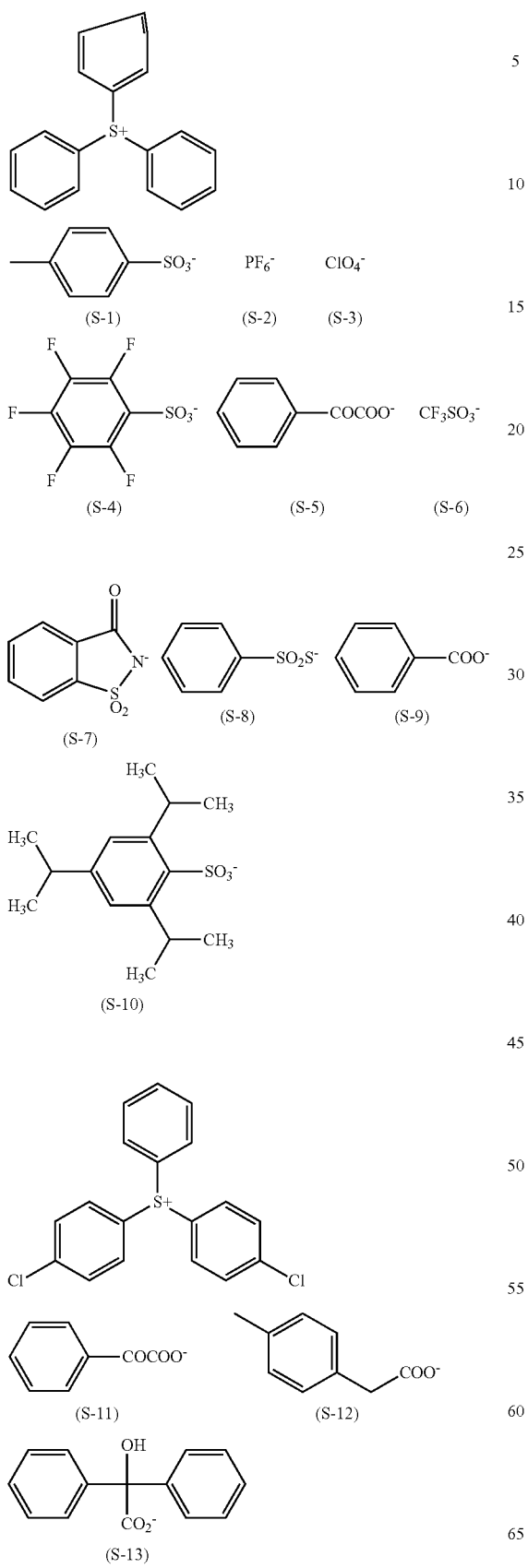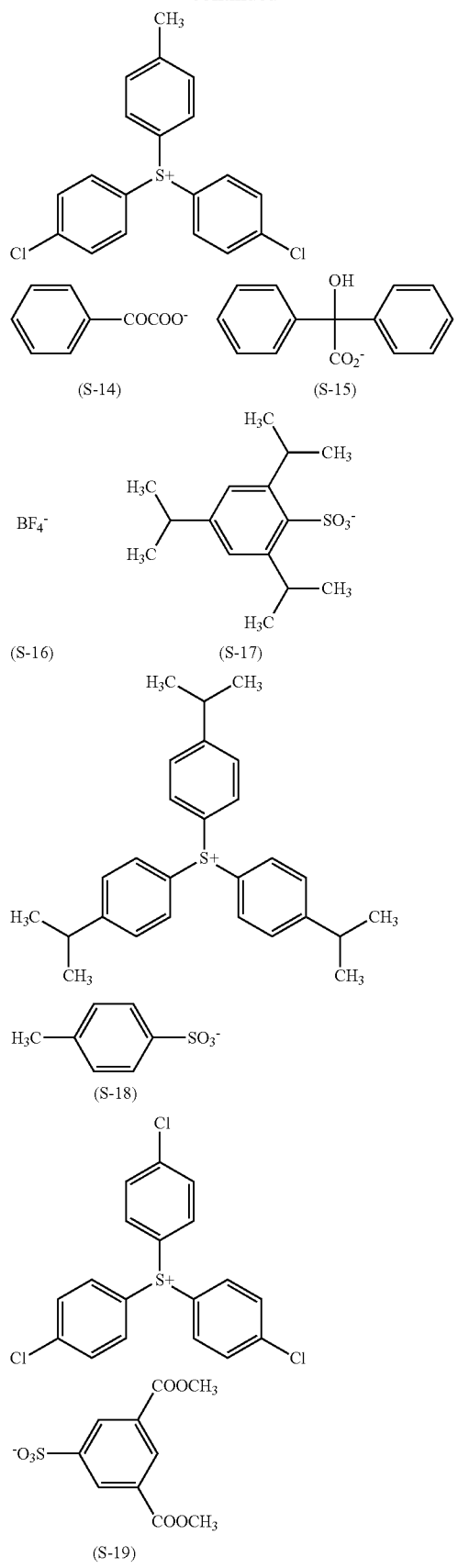

The polymerization initiator (B) is not limited to those described above. In particular, the organic halides (a), particularly, the triazine type initiators included therein, the oxime ester compounds (j) and the diazonium salts, iodonium salts and sulfonium salts included in the onium salt compounds (k) are more preferable from the standpoint of reactivity and stability. Of the polymerization initiators, onium salt compounds including as a counter ion, an inorganic anion, for example, $PF_6^-$ or $BF_4^-$ are preferable in combination with the infrared absorbing agent from the standpoint of improvement in the visibility of print-out image. Further, in view of excellence in the color-forming property, a diaryl iodonium is preferable as the onium salt.

The polymerization initiators (B) may be used individually or in combination of two or more thereof.

The polymerization initiator (B) can be added preferably in an amount from 0.1 to 50% by weight, more preferably from 0.5 to 30% by weight, particularly preferably from 0.8 to 20% by weight, based on the total solid content of the image-recording layer. In the range described above, good sensitivity and good stain resistance in the non-image area at the time of printing are obtained.

Further, the polymerization initiator (B) may be added together with other components to the same layer or may be added to the image-recording layer or a different layer adjacent thereto separately provided.

<(C) Polymerizable Compound>

The polymerizable compound (C) for use in the invention is an addition-polymerizable compound having at least one ethylenically unsaturated double bond, and it is selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof or a mixture thereof.

Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

With respect to specific examples of the monomer, which is an ester of an aliphatic polyhydric alcohol compound with an unsaturated carboxylic acid, as an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer are exemplified.

As a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane are exemplified.

As an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate are exemplified.

As a crotonic acid ester, for example, ethylene glycol dicrotonate, tetramethylene glycol dicrotonate, pentaerythritol dicrotonate or sorbitol tetradicrotonate are exemplified.

As an isocrotonic acid ester, for example, ethylene glycol diisocrotonate, pentaerythritol diisocrotonate and sorbitol tetraisocrotonate are exemplified.

As a maleic acid ester, for example, ethylene glycol dimaleate, triethylene glycol dimaleate, pentaerythritol dimaleate and sorbitol tetramaleate are exemplified.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (ii) shown below to a polyisocyanate compound having two or more isocyanate groups per molecule, described in JP-B-48-41708.

$$CH_2=C(R^4)COOCH_2CH(R^5)OH \quad \text{(ii)}$$

wherein $R^4$ and $R^5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with acrylic acid or methacrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the addition polymerizable compound, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the image-recording layer. For instance, the compatibility may be improved in some cases by using the compound of low purity or using two or more kinds of the compounds in combination. A specific structure may be selected for the purpose of improving an adhesion property to a support or a protective layer described hereinafter.

In the invention, the polymerizable compound (C) is preferably used in an amount from 5 to 80% by weight, more preferably from 25 to 75% by weight, based on the nonvolatile component of the image-recording layer.

In the method of using the addition polymerizable compound, the structure, blend and amount added can be appropriately selected by taking account of the extent of polymerization inhibition due to oxygen, resolution, fogging property, change in refractive index, surface tackiness and the like. Further, depending on the case, a layer construction, for example, an undercoat layer or an overcoat layer, and a coating method, may also be considered.

<(D) Hydrophobilizing Precursor>

The hydrophobilizing precursor for use in the invention is a fine particle capable of converting the image-recording layer to be hydrophobic when heat is applied. The fine particle is preferably at least one fine particle selected from hydrophobic thermoplastic polymer fine particles and thermo-reactive polymer fine particles.

As the hydrophobic thermoplastic polymer fine particles for use in the image-recording layer, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile or vinyl carbazole, and a mixture thereof. Of the polymers, polystyrene and polymethyl methacrylate are more preferable.

The average particle size of the hydrophobic thermoplastic polymer fine particle for use in the invention is preferably from 0.01 to 2.0 μm.

Synthesis methods of the hydrophobic thermoplastic polymer fine particle having the particle size described above for use as the hydrophobilizing precursor include an emulsion polymerization method and a suspension polymerization method. In addition, a method of dissolving the above compound in a water-insoluble organic solvent, mixing and emulsifying the solution with an aqueous solution containing a dispersant and applying heat to the emulsion, thereby solidifying the emulsion to a fine particle state while volatizing the organic solvent (a dissolution dispersion method) is also exemplified.

As the thermo-reactive polymer fine particle for use as the hydrophobilizing precursor in the invention, a thermosetting polymer fine particle and a polymer fine particle having a thermo-reactive group are exemplified. Such fine particles form a hydrophobic region by crosslinkage with a thermal reaction and change in the functional group at the time.

As the thermosetting polymer, a resin having a phenolic skeleton, a urea resin (for example, a resin obtained by resinification of urea or a urea derivative, for example, methoxymethylated urea, with an aldehyde, for example, formaldehyde), a melamine resin (for example, a resin obtained by resinification of melamine or a melamine derivative with an aldehyde, for example, formaldehyde), an alkyd resin, an unsaturated polyester resin, a polyurethane resin and an epoxy resin are exemplified. Of the resins, a resin having a phenolic skeleton, a melamine resin, a urea resin and an epoxy resin are especially preferable.

Preferable examples of the resin having a phenolic skeleton include a phenolic resin obtained by resinification of phenol or cresol with an aldehyde, for example, formaldehyde, a hydroxystyrene resin and a polymer or copolymer of methacrylamide, acrylamide, methacrylate or acrylate having a phenolic skeleton, for example, N-(p-hydroxyphenyl)methacrylamide or p-hydroxyphenyl methacrylate.

The average particle size of the thermosetting polymer fine particle for use in the invention is preferably from 0.01 to 2.0 μm.

While the thermosetting polymer fine particle can be easily obtained by a known dissolution dispersion method, it can also be prepared so as to form a fine particle when the thermosetting polymer is synthesized. However, the production method of thermosetting polymer fine particle is not limited to these methods and any known method can be appropriately employed.

As the thermo-reactive group in the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group), a cationic polymerizable group (for example, a vinyl group or a vinyloxy group) performing a radical polymerization reaction, an isocyanate group performing an addition reaction or a blocked form thereof an epoxy group, a vinyloxy group and a functional group having an active hydrogen atom (for example, an amino group, a hydroxy group or a carboxyl group) of the reaction partner, a carboxyl group performing a condensation reaction and a hydroxyl group or an amino group of the reaction partner, and an acid anhydride performing a ring opening addition reaction and an amino group or a hydroxyl group of the reaction partner are preferably exemplified.

The introduction of the functional group into polymer fine particle may be conducted at the polymerization or by utilizing a polymer reaction after the polymerization.

When the functional group is introduced at the polymerization, it is preferred that the monomer having the functional group is subjected to emulsion polymerization or suspension polymerization. Specific examples of the monomer having the functional group include allyl methacrylate, allyl acrylate, vinyl methacrylate, vinyl acrylate, 2-(vinyloxy)ethyl methacrylate, p-vinyloxystyrene, p-[2-(vinyloxy)ethyl]styrene, glycidyl methacrylate, glycidyl acrylate, 2-isocyanatoethyl methacrylate or a blocked isocyanato thereof, for example, with an alcohol, 2-isocyanatoethyl acrylate or a blocked isocyanato thereof, for example, with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, a difunctional acrylate and a difunctional methacrylate, but the invention should not be construed as being limited to thereto.

In the invention, a copolymer of the monomer having the functional group and a monomer having no thermo-reactive group copolymerizable with the monomer can also be used. Examples of the copolymerizable monomer having no thermo-reactive group include styrene, an alkyl acrylate, an alkyl methacrylate, acrylonitrile and vinyl acetate, but the copolymerizable monomer having no thermo-reactive group should not be construed as being limited thereto.

As the polymer reaction used in the case where the thermo-reactive group is introduced after the polymerization, polymer reactions described, for example, in WO 96/34316 can be exemplified.

Of the polymer fine particles having a thermo-reactive group, polymer fine particles which are coalesced with each other by heat are preferable, and those having a hydrophilic surface and dispersible in water are particularly preferable. It is preferred that the contact angle (water droplet in air) of a film prepared by coating only the polymer fine particle and drying the particle at temperature lower than the solidification temperature is lower than the contact angle (water droplet in air) of a film prepared by coating only the polymer fine particle and drying at temperature higher than the solidification temperature. For making the surface of polymer fine particle hydrophilic, it is effective to let a hydrophilic polymer or oligomer, for example, polyvinyl alcohol or polyethylene glycol, or a hydrophilic low molecular weight compound adsorb on the surface of the polymer fine particle. However, the method for hydrophilizing the surface of polymer fine particle should not be construed as being limited thereto.

The solidification temperature of the polymer fine particle having a thermo-reactive group is preferably 70° C. or higher, more preferably 100° C. or higher in consideration of the time-lapse stability. The average particle size of the polymer fine particle is preferably from 0.01 to 2.0 μm, more preferably from 0.05 to 2.0 μm, particularly preferably from 0.1 to 1.0 μm. In the range described above, good resolution and good time-lapse stability can be achieved.

In the case of forming the image-recording layer of the hydrophobilizing precursor curing type, a coating solution containing the hydrophobilizing precursor (D), the infrared absorbing agent (A) and an ammonium salt according to the invention is prepared and coated on a surface of support. In the coating solution for image-recording layer, the content of the infrared absorbing agent (A) is preferably in a range of 0.1 to 10.0% by weight in terms of solid concentration from the standpoint of sensitivity and the content of the hydrophobilizing precursor (D) is preferably in a range of 10 to 98% by weight in terms of solid concentration from the standpoint of image-forming property. The content of the ammonium salt is same as that described hereinbefore.

It is possible to use the hydrophobilizing precursor (D) as an additive for the image-recording layer of polymerization type described hereinbefore. In this case, the content of the hydrophobilizing precursor (D) is preferably in a range of 5 to 95% by weight in terms of solid concentration. By the addition thereof, the strength of image area can be improved.

<Microcapsule and/or Microgel>

The image-recording layer according to the invention preferably includes an embodiment containing microcapsule and/or microgel from the standpoint of obtaining good on-machine development property. Specifically, according to the embodiment, the above-described constituting components of the image-recording layer (A) to (C) and other constituting components described hereinafter are incorporated into a microcapsule or microgel.

The microcapsule for use in the invention is a microcapsule containing all or part of the constituting components of the image-recording layer encapsulated therein as described, for example, in JP-A-2001-277740 and JP-A-2001-277742. The constituting components of the image-recording layer may be present outside the microcapsules. It is a preferable embodiment of the image-recording layer containing microcapsules that hydrophobic constituting components are encapsulated in the microcapsules and hydrophilic components are present outside the microcapsules.

On the other hand, the image-recording layer according to the invention may include an embodiment containing a crosslinked resin particle, that is, a microgel. The microgel can contain a part of the constituting components (A) to (C) inside and/or on the surface thereof. Particularly, an embodiment of a reactive microgel containing the polymerizable compound (C) on the surface thereof is preferable in view of the image-forming sensitivity and printing durability.

As a method of microencapsulation or microgelation of the constituting components of the image-recording layer, known methods can be employed.

Methods of producing the microcapsule include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and polyurea and polyurethane are particularly preferred. Further, a compound having a crosslinkable functional group, for example, an ethylenically unsaturated bond, capable of being introduced into a binder polymer described hereinafter may be introduced into the microcapsule wall.

On the other hand, methods of preparing the microgel include, for example, a method of utilizing granulation by interfacial polymerization described in JP-B-38-19574 and JP-B-42-446 and a method of utilizing granulation by dispersion polymerization in a non-aqueous system described in JP-A-5-61214, but the invention should not be construed as being limited thereto.

To the method utilizing interfacial polymerization, known production methods of microcapsule can be applied.

The microgel preferably used in the invention is granulated by interfacial polymerization and has three-dimensional crosslinking. From this point of view, a preferable material to be used includes polyurea, polyurethane, polyester, polycarbonate, polyamide and a mixture thereof, and polyurea and polyurethane are particularly preferred.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

<Other Components of Image-Recording Layer>

The image-recording layer according to the invention may contain other components, if desired. Other components constituting the image-recording layer according to the invention will be described blow.

(1) Binder Polymer

In the image-recording layer according to the invention, a binder polymer can be used for the purpose of improving a film strength of the image-recording layer. The binder polymer which can be used in the invention can be selected from those heretofore known without restriction, and polymers having a film-forming property are preferable. Examples of the binder polymer include acrylic resins, polyvinyl acetal resins, polyurethane resins, polyurea resins, polyimide resins, polyamide resins, epoxy resins, methacrylic resins, polystyrene resins, novolac type phenolic resins, polyester resins, synthesis rubbers and natural rubbers.

The binder polymer may have a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —$(CH_2)_nCR^1$=$CR^2R^3$, —$(CH_2O)_nCH_2CR^1$=$CR^2R^3$, —$(CH_2CH_2O)_nCH_2CR^1$=$CR^2R^3$, —$(CH_2)_nNH$—CO—O—$CH_2CR^1$=$CR^2R^3$, —$(CH_2)_n$—O—CO—$CR^1$=$CR^2R^3$ and —$(CH_2CH_2O)_2$—X (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include —$CH_2CH$=$CH_2$ (described in JP-B-7-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2NHCOO$—$CH_2CH$—$CH_2$ and —$CH_2CH_2O$—X (wherein X represents a dicyclopentadienyl residue).

Specific examples of the amide residue include —$CH_2CH$=$CH_2$, —$CH_2CH_2$—Y (wherein Y represents a cyclohexene residue) and —$CH_2CH_2$—OCO—$CH$=$CH_2$.

The binder polymer having crosslinkable property is cured, for example, by addition of a free radical (a polymerization initiating radical or a growing radical of a polymerizable compound during polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radial and connecting the polymer radicals with each other to form cross-linkage between the polymer molecules.

The content of the crosslinkable group in the binder polymer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

From the standpoint of improvement in the on-machine development property in the unexposed area of the image-recording layer, it is preferred that the binder polymer has high solubility or high dispersibility in ink and/or dampening water. In order to increase the solubility or dispersibility in the ink, the binder polymer is preferably oleophilic and in order to increase the solubility or dispersibility in the dampening water, the binder polymer is preferably hydrophilic. Therefore, it is effective in the invention that an oleophilic binder polymer and a hydrophilic binder polymer are used in combination.

The hydrophilic binder polymer preferably includes, for example, a polymer having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group or a phosphoric acid group.

Specific examples the hydrophilic binder polymer include gum arabic, casein, gelatin, a starch derivative, carboxy methyl cellulose and a sodium salt thereof, cellulose acetate, sodium alginate, a vinyl acetate-maleic acid copolymer, a styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or copolymer of acrylamide, a homopolymer or polymer of methacrylamide, a homopolymer or copolymer of N-methylolacrylamide, polyvinyl pyrrolidone, an alcohol-soluble nylon, a polyether of 2,2-bis-(4-hydroxyphenyl)propane and epichlorohydrin.

The weight average molecular weight of the binder polymer is preferably 5,000 or more, more preferably from 10,000 to 300,000. The number average molecular weight of the binder polymer is preferably 1,000 or more, more preferably from 2,000 to 250,000. The polydispersity (weight average molecular weight/number average molecular weight) thereof is preferably from 1.1 to 10.

The binder polymer is available by purchasing a commercial product or synthesizing according to a known method.

The content of the binder polymer is ordinarily from 5 to 90% by weight, preferably from 5 to 80% by weight, more preferably from 10 to 70% by weight, based on the total solid content of the image-recording layer. In the range described above, good strength of the image area and good image-forming property can be obtained.

It is preferred that the polymerizable compound (C) and the binder polymer are used in a weight ratio of 0.5/1 to 4/1.

(2) Surfactant

In the image-recording layer according to the invention, a surfactant can be used in order to promote the on-machine development property and to improve the state of coated surface.

The surfactant used includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and those hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialkylamine oxides, polyethylene glycols, and copolymers of polyethylene glycol and polypropylene glycol.

The anionic surfactant used in the invention is not particularly restricted and those hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxyethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and those hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and those hitherto known can be used. Examples of the amphoteric surfactant include carboxybetaines, aminocarboxylic acids, sulfobetaines, aminosulfuric esters, and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkyl phosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants can be used individually or in combination of two or more thereof.

The content of the surfactant is preferably from 0.001 to 10% by weight, more preferably from 0.01 to 5% by weight, based on the total solid content of the image-recording layer.

(3) Coloring Agent

In the image-recording layer according to the invention, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (produced by Orient Chemical Industries, Ltd.), Victoria pure blue, Crystal violet (CI12555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image.

The amount of the coloring agent added is preferably from 0.01 to 10% by weight based on the total solid content of the image-recording layer.

(4) Print-Out Agent

To the image-recording layer according to the invention, a compound undergoing discoloration with an acid or radical can be added in order to form a print-out image.

As a compound used for such a purpose, various dyes, for example, of diphenylmethane type, triphenylmethane type, thiazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfophthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, Rhodamine 6G, Sulfo rhodamine B, Auramine, 4-p-diethylaminophenyliminonaphthoquione, 2-carboxyanilino-4-p-diethylaminophenyliminonaphthoquinone, 2-carboxystearylamino-4-p-N,N-bis(hydroxyethyl) aminophenyliminonaphthoquinone, 1-phenyl-3-methyl-4-p-diethylaminophenylimino-5-pyrazolon or 1-β-naphtyl-4-p-diethylaminophenylimino-5-pyrazolon, and a leuco dye, for example, p,p',p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N-N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The amount of the dye undergoing discoloration with an acid or radical is preferably from 0.01 to 10% by weight based on the solid content of the image-recording layer.

(5) Polymerization Inhibitor

It is preferred to add a small amount of a thermal polymerization inhibitor to the image-recording layer according to the invention in order to inhibit undesirable thermal polymerization of the polymerizable compound (C) during the production or preservation of the image-recording layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the image-recording layer.

(6) Higher Fatty Acid Derivative

To the image-recording layer according to the invention, a higher fatty acid derivative, for example, behenic acid or behenic acid amide may be added to localize on the surface of the image-recording layer during a drying step after coating in order to avoid polymerization inhibition due to oxygen.

The amount of the higher fatty acid derivative added is preferably from about 0.1 to about 10% by weight based on the total solid content of the image-recording layer.

(7) Plasticizer

The image-recording layer according to the invention may contain a plasticizer in order to improve the on-machine development property.

The plasticizer preferably includes, for example, a phthalic acid ester, e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, e.g., dimethylglycol phthalate, ethylphthalylethyl glycolate, methylphthalylethyl glycolate, butylphthalylbutyl glycolate or triethylene glycol dicaprylate ester; a phosphoric acid ester, e.g., trieresyl phosphate or triphenyl phosphate; an aliphatic dibasic acid ester, e.g., diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate.

The amount of the plasticizer is preferably about 30% by weight or less based on the total solid content of the image-recording layer.

(8) Fine Inorganic Particle

The image-recording layer according to the invention may contain fine inorganic particle in order to increase the strength of cured film and to improve the on-machine development property.

The fine inorganic particle preferably includes, for example, silica, alumina, magnesium oxide, titanium oxide, magnesium carbonate, calcium alginate and a mixture thereof. The fine inorganic particle can be used, for example, for strengthening the film or enhancing interface adhesion property due to surface roughening.

The fine inorganic particle preferably has an average particle size from 5 nm to 10 μm, more preferably from 0.5 to 3 μm. In the range described above, it is stably dispersed in the image-recording layer, sufficiently maintains the film strength of the image-recording layer and can form the non-imaging area excellent in hydrophilicity and prevented from the occurrence of stain at the time of printing.

The fine inorganic particle described above is easily available as a commercial product, for example, colloidal silica dispersion.

The amount of the fine inorganic particle added is preferably 40% by weight or less, more preferably 30% by weight or less, based on the total solid content of the image-recording layer.

(9) Hydrophilic Low Molecular Weight Compound

The image-recording layer according to the invention may contain a hydrophilic low molecular weight compound in order to improve the on-machine development property without accompanying the degradation of printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof.

Of the compounds, an organic sulfonic acid, an organic sulfamic acid or a salt, for example, sodium salt or lithium salt of organic sulfuric acid is preferably used.

Specific examples of the salt of organic sulfonic acid include sodium n-butylsulfonate, sodium isobutylsulfonate, sodium sec-butylsulfonate, sodium tert-butylsulfonate, sodium n-pentylsulfonate, sodium 1-ethylpropylsulfonate, sodium n-hexylsulfonate, sodium 1,2-dimethylpropylsulfonate, sodium 2-ethylbutylsulfonate, sodium cyclohexylsulfonate, sodium n-heptylsulfonate, sodium n-octylsulfonate, sodium tert-octylsulfonate, sodium n-nonylsulfonate, sodium allylsulfonate, sodium 2-methylallylsulfonate, sodium benzenesulfonate, sodium p-toluenesulfonate, sodium p-hydroxybenzenesulfonate, sodium p-styrenesulfonate, sodium isophthalic acid dimethyl-5-sulfonate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphtylsulfonate, sodium 2-naphtylsulfonate, sodium 4-hydroxynaphtylsulfonate, disodium 1,5-naphtyldisulfonate, disodium 2,6-naphtyldisulfonate, trisodium 1,3,6-naphtyltrisulfonate and lithium salts of these compounds wherein the sodium is exchanged with lithium.

Specific examples of the salt of organic sulfamic acid include sodium n-butylsulfamate, sodium isobutylsulfamate, sodium tert-butylsulfamate, sodium n-pentylsulfamate, sodium 1-ethylpropylsulfamate, sodium n-hexylsulfamate, sodium 1,2-dimethylpropylsulfamate, sodium 2-ethylbutylsulfamate, sodium cyclohexylsulfamate and lithium salts of these compounds wherein the sodium is exchanged with lithium.

The hydrophilic low molecular weight compound has the hydrophobic part of a small structure and almost no surface active function so that it can be clearly distinguished from the surfactant described hereinbefore in which a long-chain alkylsulfonate or a long-chain alkylbenzenesulfonate is preferably used.

As the salt of organic sulfuric acid, a compound represented by formula (iii) shown below is particularly preferably used.

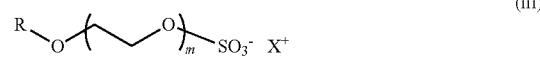

In formula (iii), R represents an alkyl group, an alkenyl group, an alkynyl group, an aryl group or a heterocyclic group, m represents an integer of 1 to 4, and X represents sodium, potassium or lithium.

R in formula (iii) preferably represents a straight-chain, branched or cyclic alkyl group having from 1 to 12 carbon atoms, an alkenyl group having from 1 to 12 carbon atoms, an alkynyl group having from 1 to 12 carbon atoms or an aryl group having 20 or less carbon atoms. These groups may have a substituent and examples of the substituent which may be introduced include a straight-chain, branched or cyclic alkyl group having from 1 to 12 carbon atoms, an alkenyl group having from 1 to 12 carbon atoms, an alkynyl group having from 1 to 12 carbon atoms, a halogen atom and an aryl group having 20 or less carbon atoms.

Preferable examples of the compound represented by formula (iii) include sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate and sodium dioxyethylene lauryl ether sulfate. Most preferable examples thereof include sodium dioxyethylene 2-ethylhexyl ether sulfate, potassium dioxyethylene 2-ethylhexyl ether sulfate and lithium dioxyethylene 2-ethylhexyl ether sulfate.

The amount of the hydrophilic low molecular weight compound added to the image-recording layer is preferably from 0.5 to 20% by weight, more preferably from 1 to 10% by weight, still more preferably from 2 to 8% by weight, based on the total solid content of the image-recording layer. In the range described above, good on-machine development property and good printing durability are achieved.

The hydrophilic low molecular weight compounds may be used individually or as a mixture of two or more thereof.

(10) Oil-Sensitizing Agent

In the lithographic printing plate precursor according to the invention, a phosphonium compound may be added as the oil-sensitizing agent to the image-recording layer and/or protective layer in order to improve the ink-receptive property. As preferable examples of the phosphonium compound, compounds represented by formula (iv) shown below as described in JP-A-2006-297907 and compounds represented by formula (v) shown below as described in JP-A-2007-50660 are exemplified.

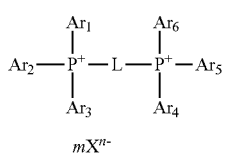

(v)

In formula (iv), $R_1$ to $R_4$ each independently represents an alkyl group, an alkenyl group, an alkynyl group, a cycloalkyl group, an alkoxy group, an aryl group, an aryloxy group, an alkylthio group, an arylthio group or a heterocyclic group, each of which may have a substituent, or a hydrogen atom, or at least two of $R_1$ to $R_4$ may be combined with each other to form a ring, and $X^-$ represents a counter anion.

In formula (v), $Ar_1$ to $Ar_6$ each independently represents an aryl group or a heterocyclic group, L represents a divalent connecting group, $X^{n-}$ represents a n-valent counter anion, n represents an integer of 1 to 3, and m represents a number satisfying n×m=2. In the formula, the aryl group preferably includes, for example, a phenyl group, a naphthyl group, a tolyl group, a xylyl group, a fluorophenyl group, a chlorophenyl group, a bromophenyl group, a methoxyphenyl group, an ethoxyphenyl group, a dimethoxyphenyl group, a methoxycarbonylphenyl group and a dimethylaminophenyl group. The heterocyclic group preferably includes, for example, a pyridyl group, a quinolyl group, a pyrimidinyl group, a thienyl group and a furyl group. L represents a divalent connecting group and a number of carbon atoms included in the connecting group is preferably from 6 to 15, more preferably from 6 to 12. $X^{n-}$ represents a n-valent counter anion and preferable examples of the counter anion include a halogen anion, for example, $Cl^-$, $Br^-$ or $I^-$, a sulfonate anion, a carboxylate anion, a sulfate ester anion, $PF_6^-$, $BF_4^-$ and a perchlorate anion. Among them, a halogen anion, for example, $Cl^-$, $Br^-$ or $I^-$, a sulfonate anion and a carboxylate anion are particularly preferable.

Specific examples of the phosphonium compound represented by formula (iv) or (v) are set forth below.

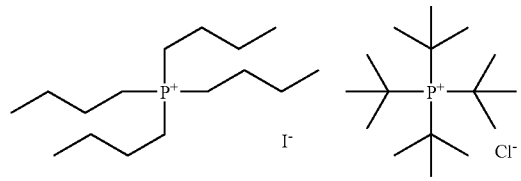

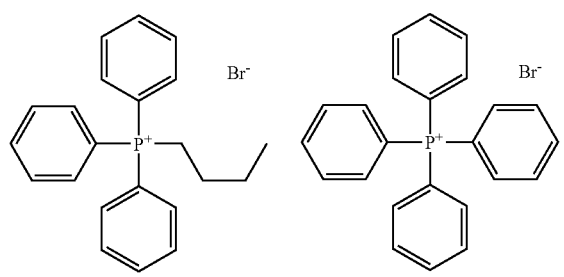

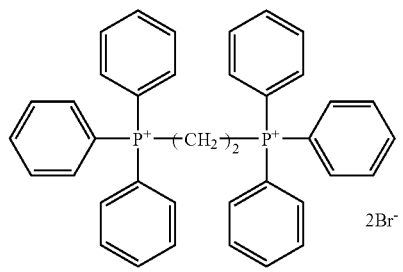

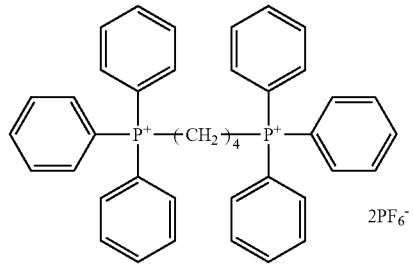

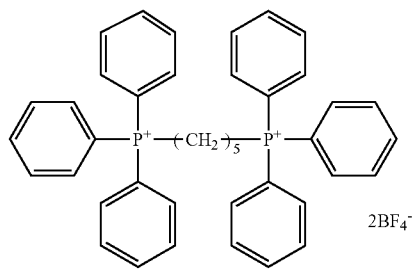

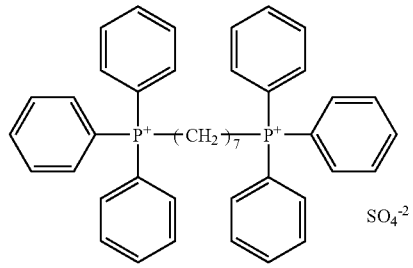

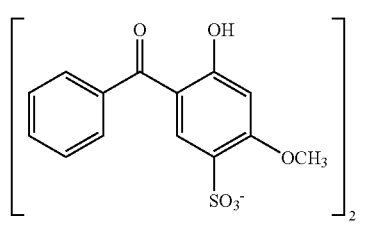

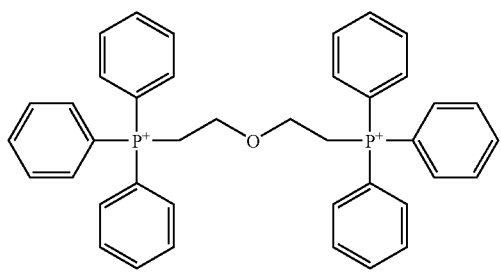

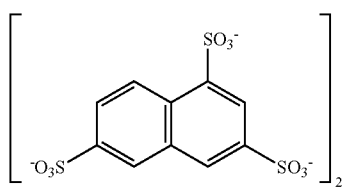

A nitrogen-containing compound described below is also suitably exemplified as the oil-sensitizing agent as well as the phosphonium compound. A preferable example of the nitrogen-containing compound has a structure represented by the following formula (I):

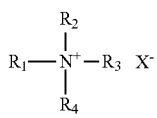

(I)

In formula (I), $R_1$ to $R_4$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, or at least two of $R_1$ to $R_4$ may be combined with each other to form a ring, and $X^-$ represents an anion including $PF_6^-$, $BF_4^-$ or an organic sulfonate anion having a substituent selected from an alkyl group, an alkenyl group, an alkynyl group, a cycloalkyl group, an alkoxy group, an aryl group, an aralkyl group and a heterocyclic group.

Specifically, the nitrogen-containing compound according to the invention may have a structure of an amine salt in which at least one of $R^1$ to $R_4$ is a hydrogen atom, a quaternary ammonium salt in which all of $R^1$ to $R_4$ are not hydrogen atoms, an imidazolinium salt represented by formula (II) shown below, a benzimidazolinium salt represented by formula (III) shown below, a pyridinium salt represented by formula (IV) shown below, or a quinolinium salt represented by formula (V) shown below.

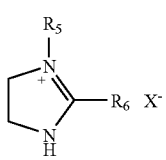

(II)

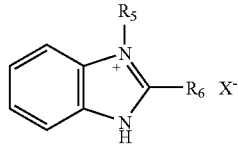

(III)

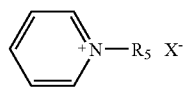

(IV)

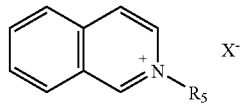

(V)

In the above formulae, $R_5$ and $R_6$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, and $X^-$ represents an anion including $PF_6^-$, $BF_4^-$ or an organic sulfonate anion having a substituent selected from an alkyl group, an alkenyl group, an alkynyl group, a cycloalkyl group, an alkoxy group, an aryl group, an aralkyl group and a heterocyclic group.

Of the nitrogen-containing compounds, the quaternary ammonium salt and pyridinium salt are preferably used.

Specific examples of the quaternary ammonium salt are set forth below.

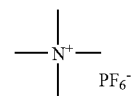

(A-1)

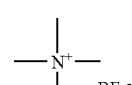

(A-2)

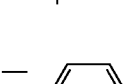

(A-3)

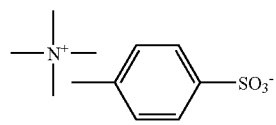

(A-4)

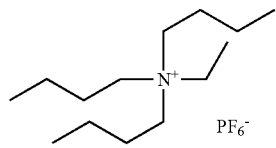

(A-5)

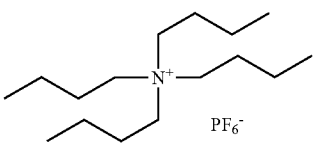

(A-6)

(A-7) 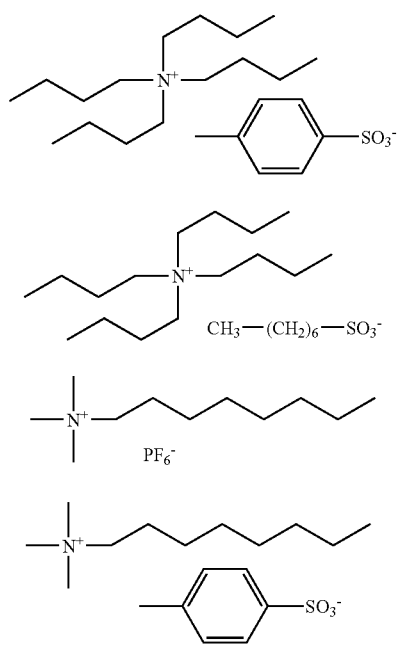
(A-8)
(A-9)
(A-10)
(A-11)
(A-12)
(A-13)
(A-14)
(A-15)
(A-16)
(A-17) 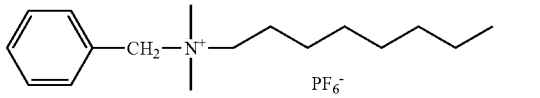
(A-18) 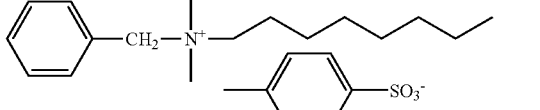
(A-19) 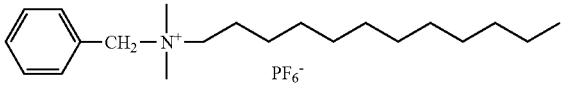
(A-20) 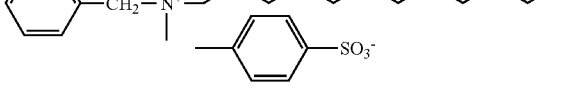
Specific examples of the pyridinium salt are set forth below.
(P-1) 
(P-2) 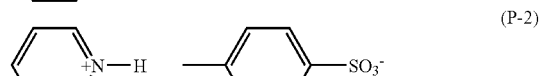
(P-3) 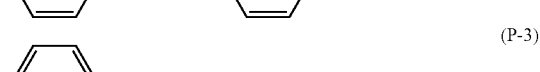
(P-4) 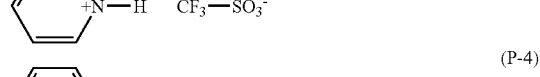
(P-5) 
(P-6) 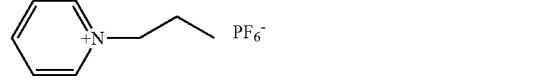
(P-7) 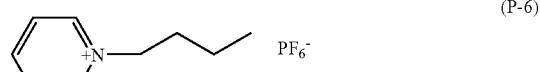
(P-8) 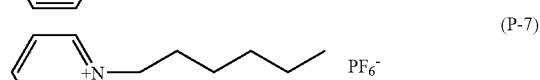
(P-9) 

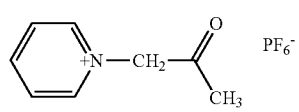

(P-10)

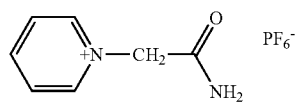

(P-11)

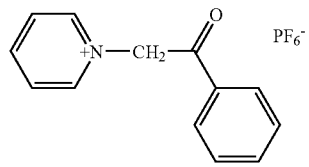

(P-12)

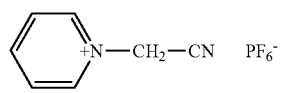

(P-13)

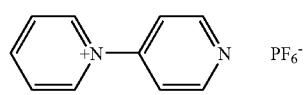

(P-14)

The amount of the oil-sensitizing agent added to the image-recording layer or protective layer is preferably from 0.01 to 20% by weight, more preferably from 0.05 to 10% by weight, most preferably from 0.1 to 5% by weight, based on the solid content of each of the layer. In the range described above, good ink-receptive property is obtained.

<Formation of Image-Recording Layer>

The image-recording layer according to the invention is formed by dispersing or dissolving each of the necessary constituting components described above in a solvent to prepare a coating solution and coating the solution on a support, followed by drying.

The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid content concentration of the coating solution is preferably from 1 to 50% by weight.

The image-recording layer according to the invention may also be an image-recording layer having a multilayer structure which is formed by preparing plural coating solutions by dispersing or dissolving the same or different components described above into the same or different solvents and conducting repeatedly the coating and drying plural times.

The coating amount of the image-recording layer (solid content) formed on a support after drying may be varied according to the intended purpose but is preferably from 0.3 to 3.0 g/m². In the range described above, good sensitivity and good film property of the image-recording layer can be achieved.

Various methods can be used for the coating. Examples of the coating method include bar coater coating, spin coating, spray coating, curtain coating, dip coating, air knife coating, blade coating and roll coating.

(Protective Layer)

In the lithographic printing plate precursor according to the invention, it is preferable to provide a protective layer (overcoat layer) on the image-recording layer.

The protective layer has a function for preventing, for example, occurrence of scratch in the image-recording layer or ablation caused by exposure with a high illuminance laser beam, in addition to the function for restraining an inhibition reaction against the image formation by means of oxygen blocking.

Components constituting the protective layer will be described below.

Ordinarily, the exposure process of a lithographic printing plate precursor is performed in the air. The image-forming reaction occurred upon the exposure process in the image-recording layer may be inhibited by a low molecular weight compound, for example, oxygen or a basic substance present in the air. The protective layer prevents the low molecular weight compound, for example, oxygen or a basic substance from penetrating into the image-recording layer and as a result, the inhibition of image-forming reaction at the exposure process in the air can be avoided. Accordingly, the property required of the protective layer is to reduce permeability of the low molecular compound, for example, oxygen. Further, the protective layer preferably has good transparency to light used for the exposure, is excellent in an adhesion property to the image-recording layer, and can be easily removed during the on-machine development processing step after the exposure. With respect to the protective layer having such properties, there are described, for example, in U.S. Pat. No. 3,458,311 and JP-B-55-49729.

As a material for use in the protective layer, any water-soluble polymer and water-insoluble polymer can be appropriately selected to use. Specifically, a water-soluble polymer, for example, polyvinyl alcohol, a modified polyvinyl alcohol, polyvinyl pyrrolidone, polyvinyl imidazole, polyacrylic acid, polyacrylamide, a partially saponified product of polyvinyl acetate, an ethylene-vinyl alcohol copolymer, a water-soluble cellulose derivative, gelatin, a starch derivative or gum arabic, and a polymer, for example, polyvinylidene chloride, poly (meth)acrylonitrile, polysulfone, polyvinyl chloride, polyethylene, polycarbonate, polystyrene, polyamide or cellophane are exemplified.

The polymers may be used in combination of two or more thereof, if desired.

As a relatively useful material for use in the protective layer, a water-soluble polymer compound excellent in crystallinity is exemplified. Specifically, polyvinyl alcohol, polyvinyl pyrrolidone, polyvinyl imidazole, a water-soluble acrylic resin, for example, polyacrylic acid, gelatin or gum arabic is preferably used. Above all, polyvinyl alcohol, polyvinyl pyrrolidone and polyvinyl imidazole are more preferably used from the standpoint of capability of coating with water as a solvent and easiness of removal with dampening water at the printing. Among them, polyvinyl alcohol (PVA) provides most preferable results on the fundamental properties, for example, oxygen blocking property or removability with development.

The polyvinyl alcohol for use in the protective layer may be partially substituted with ester, ether or acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer chain a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are also preferably used.

Preferable examples of the polyvinyl alcohol include those having a hydrolysis degree of 71 to 100% by mole and a polymerization degree of 300 to 2,400. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12F or HL-1203 and that having a reactive silane-modified cite, for example, R-1130, R-2105 or R-2130.

It is also preferable that the protective layer contains an inorganic stratiform compound, that is, an inorganic compound having a stratiform structure and a tabular shape. By using the inorganic stratiform compound together, in addition that the oxygen blocking property is more increased and the film strength of the protective layer is more increased to improve the scratch resistance, a matting property is imparted to the protective layer.

The stratiform compound includes, for instance, mica, for example, natural mica represented by the following formula: $A(B,C)_{2-5}D_4O_{10}(OH,F,O)_2$, (wherein A represents any one of Li, K, Na, Ca, Mg and an organic cation, B and C each represents any one of Fe (II), Fe(III), Mn, Al, Mg and V, and D represents Si or Al) or synthetic mica, talc represented by the following formula: $3MgO.4SiO.H_2O$, teniolite, montmorillonite, saponite, hectolite and zirconium phosphate.

Of the mica compounds, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$ and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the mica compounds, fluorine-based swellable mica, which is a synthetic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation, e.g., an amine salt, a quaternary ammonium salt, a phosphonium salt or a sulfonium salt is adsorbed between the lattice layers. The stratiform compound swells upon contact with water. When share is applied under such condition, the stratiform crystal lattices are easily cleaved to form a stable sol in water. Since the bentonite and swellable synthetic mica have strongly such tendency, they are useful for the invention and particularly, the swellable synthetic mica is preferably used in the invention from the standpoint of ready availability and uniformity of the quality.

The shape of the stratiform compound is tabular and from the standpoint of control of diffusion, the thinner the thickness or the larger the plain size as long as smoothness of coated surface and transmission of actinic radiation are not damaged, the better. Therefore, an aspect ratio of the stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle diameter of the stratiform compound, an average diameter is ordinarily from 0.3 to 20 μm, preferably from 0.5 to 10 μm, particularly preferably from 1 to 5 μm. When the particle diameter is less than 0.3 μm, the inhibition of permeation of oxygen or moisture is insufficient and the effect of the stratiform compound can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, particularly preferably 0.01 μm or less. For example, with respect to the swellable synthetic mica that is the representative compound of the inorganic stratiform compounds, the thickness is approximately from 1 to 50 nm and the plain size is approximately from 1 to 20 μm.

When such an inorganic stratiform compound particle having a large aspect ratio is incorporated into the protective layer, strength of the coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

An example of common dispersing method for using the stratiform compound in the protective layer is described below.

Specifically, from 5 to 10 parts by weight of a swellable stratiform compound which is exemplified as a preferable stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having Polman whistle. A dispersion containing from 5 to 10% by weight of the inorganic stratiform compound thus prepared is highly viscous or gelled and exhibits extremely good preservation stability.

In the formation of a coating solution for protective layer using the dispersion, it is preferred that the dispersion is diluted with water, sufficiently stirred and then mixed with a binder solution.

The content of the inorganic stratiform compound in the protective layer is ordinarily from 5/1 to 1/100 in terms of a weight ratio of the inorganic stratiform compound to an amount of a binder used in the protective layer. When a plural kind of the inorganic stratiform compounds is used together, it is preferred that the total amount of the inorganic stratiform compounds is in the range of weight ratio described above.

As other additive for the protective layer, glycerin, dipropylene glycol, propionamide, cyclohexane diol, sorbitol or the like can be added in an amount corresponding to several % by weight of the water-soluble or water-insoluble polymer to impart flexibility. Also, a known additive, for example, a water-soluble (meth)acrylic polymer or a water-soluble plasticizer can be added in order to improve the physical property of the protective layer.

Further, the protective layer according to the invention is formed using a coating solution for protective layer as described below and to the coating solution for protective layer may be added known additives for increasing an adhesion property to the image-recording layer or for improving time-lapse stability of the coating solution.

Specifically, an anionic surfactant, a nonionic surfactant, a cationic surfactant or a fluorine-based surfactant can be added to the coating solution of protective layer in order to improve the coating property. More specifically, an anionic surfactant, for example, sodium alkyl sulfate or sodium alkyl sulfonate; an amphoteric surfactant, for example, alkylamino carboxylic acid salt or alkylamino dicarboxylic acid salt; or a nonionic surfactant, for example, polyoxyethylene alkyl phenyl ether can be added. The amount of the surfactant added is from 0.1 to 100% by weight of the water-soluble or water-insoluble polymer.

Further, for the purpose of improving the adhesion property to the image-recording layer, for example, it is described in JP-A-49-70702 and BP-A-1,303,578 that sufficient adhesion can be obtained by mixing from 20 to 60% by weight of an acrylic emulsion, a water-insoluble vinyl pyrrolidone-vinyl acetate copolymer or the like in a hydrophilic polymer mainly comprising polyvinyl alcohol and coating the mixture on the image-recording layer. In the invention, any of such known techniques can be used.

Moreover, other functions can also be provided to the protective layer. For instance, by adding a coloring agent (for example, a water-soluble dye), which is excellent in permeability for infrared ray used for the exposure and capable of efficiently absorbing light at other wavelengths, a safe light adaptability can be improved without causing decrease in the sensitivity.

The formation of protective layer is performed by coating a coating solution for protective layer prepared by dispersing or dissolving the components of protective layer in a solvent on the image-recording layer, followed by drying.

The coating solvent may be appropriately selected in view of the binder used, and when a water-soluble polymer is used, distilled water or purified water is preferably used as the solvent.

A coating method of the protective layer is not particularly limited, and known methods, for example, methods described in U.S. Pat. No. 3,458,311 and JP-B-55-49729 can be utilized.

Specifically, in the formation of protective layer, for example, a blade coating method, an air knife coating method, a gravure coating method, a roll coating method, a spray coating method, a dip coating method or a bar coating method is used.

The coating amount of the protective layer is preferably in a range from 0.01 to 10 g/m$^2$, more preferably in a range from 0.02 to 3 g/m$^2$, most preferably in a range from 0.02 to 1 g/m$^2$, in terms of the coating amount after drying.

(Support)

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above.

A preferable support includes a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

In advance of the use of aluminum plate, a surface treatment, for example, roughening treatment or anodizing treatment is preferably performed. The surface treatment facilitates improvement in the hydrophilic property and ensure for adhesion property between the image-recording layer and the support. Prior to the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball graining, brush graining, blast graining or buff graining can be used. Also, a transfer method can be employed wherein using a roll having concavo-convex shape the concavo-convex shape is transferred to the surface of aluminum plate during a rolling step of aluminum plate.

The electrochemical roughening treatment method includes, for example, a method of conducting by passing alternating current or direct current in an electrolytic solution containing an acid, for example, hydrochloric acid or nitric acid. Also, a method of using a mixed acid described in JP-A-54-63902 can be exemplified.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for improving the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$, more preferably from 1.5 to 4.0 g/m$^2$. In the range described above, good printing durability and good scratch resistance in the non-image area of lithographic printing plate can be achieved.

The aluminum plate subjected to the surface treatment and having the anodized film is used as it is as the support in the invention. However, in order to more improve the adhesion property to a layer provided thereon, hydrophilicity, stain resistance, heat insulating property or the like, other treatment, for example, an enlarging treatment of micropores or a sealing treatment of micropores of the anodized film described in JP-A-2001-253181 and JP-A-2001-322365, or a surface hydrophilizing treatment by immersing in an aqueous solution containing a hydrophilic compound may be appropriately conducted. Needless to say, the enlarging treatment and sealing treatment are not limited to those described in the abovedescribed patents and any conventionally known method may be employed. For instance, as the sealing treatment, as well as a sealing treatment with steam, a sealing treatment with fluorozirconic acid alone, a sealing treatment with sodium fluoride or a sealing treatment with steam having added thereto lithium chloride may be employed.

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatment is described in more detail below.

<1> Sealing Treatment with Aqueous Solution Containing Inorganic Fluorine Compound As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of performing satisfactory sealing of micropores of the anodized film, and it is preferably 1% by weight or less, more preferably 0.5% by weight or less, in view of stain resistance.

The aqueous solution containing an inorganic fluorine compound preferably further contains a phosphate compound. When the phosphate compound is contained, the hydrophilicity on the anodized film surface is increased and thus, the on-machine development property and stain resistance can be improved.

Preferable examples of the phosphate compound include phosphates of metal, for example, an alkali metal or an alkaline earth metal.

Specific examples of the phosphate compound include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of the inorganic fluorine compound and the phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-machine development property and stain resistance, and it is preferably 20% by weight or less, more preferably 5% by weight or less, in view of solubility.

The ratio of respective compounds in the aqueous solution is not particularly limited, and the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably 1 or more, more preferably 2 or more, and it is preferably 11 or less, more preferably 5 or less.

A method of the sealing treatment with the aqueous solution containing an inorganic fluorine compound is not particularly limited, and examples thereof include a dipping method and a spray method. One of the treatments may be used alone once or multiple times, or two or more thereof may be used in combination.

In particular, the dipping method is preferred. In the case of performing the treatment using the dipping method, the treating time is preferably one second or more, more preferably 3 seconds or more, and it is preferably 100 seconds or less, more preferably 20 seconds or less.

<2> Sealing Treatment with Water Vapor

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably in a range from (atmospheric pressure−50 mmAq) to (atmospheric pressure+300 mmAq) (from $1.008 \times 10^5$ to $1.043 \times 10^5$ Pa).

The time period for which water vapor is contacted is preferably one second or more, more preferably 3 seconds or more, and it is preferably 100 seconds or less, more preferably 20 seconds or less.

<3> Sealing Treatment with Hot Water

Examples of the sealing treatment with hot water include a method of dipping the aluminum plate having formed thereon the anodized film in hot water.

The hot water may contain an inorganic salt (for example, a phosphate) or an organic salt.

The temperature of the hot water is preferably 80° C. or more, more preferably 95° C. or more, and it is preferably 100° C. or less.

The time period for which the aluminum plate is dipped in hot water is preferably one second or more, more preferably 3 seconds or more, and it is preferably 100 seconds or less, more preferably 20 seconds or less.

The hydrophilizing treatment describe above includes an alkali metal silicate method described in U.S. Pat. Nos. 2,714,066, 3,181,461, 3,280,734 and 3,902,734. In the method, the support is subjected to immersion treatment or electrolytic treatment in an aqueous solution containing, for example, sodium silicate. In addition, the hydrophilizing treatment includes, for example, a method of treating with potassium fluorozirconate described in JP-B-36-22063 and a method of treating with polyvinyl phosphonic acid described in U.S. Pat. Nos. 3,276,868, 4,153,461, and 4,689,272.

In the case of using a support having a surface of insufficient hydrophilicity, for example, a polyester film, as the support in the invention, it is desirable to coat a hydrophilic layer thereon to make the surface sufficiently hydrophilic. The hydrophilic layer preferably includes a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate and a hydrophilic layer comprising an inorganic thin layer having a surface containing a metal oxide. Among them, the hydrophilic layer formed by coating a coating solution containing a colloid of an oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 µm. In the range described above, good adhesion property to the image-recording layer, good printing durability and good stain resistance can be achieved.

The thickness of the support is preferably from 0.1 to 0.6 mm, more preferably from 0.15 to 0.4 mm.

(Backcoat Layer)

After applying the surface treatment to the support or forming an undercoat layer described hereinafter on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

(Undercoat Layer)

In the lithographic printing plate precursor according to the invention, an undercoat layer is provided between the support and the image-recording layer, if desired.

The undercoat layer makes removal of the image-recording layer from the support in the unexposed area easy so that the on-machine development property can be improved. Further, it is advantageous that in the case of infrared laser exposure, since the undercoat layer acts as a heat insulating layer, heat generated upon the exposure does not diffuse into the support and is efficiently utilized so that increase in sensitivity can be achieved.

As a compound for the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable compound for undercoat layer, a polymer resin having an adsorbing group, a hydrophilic group and a crosslinkable group is exemplified. The polymer resin is preferably a polymer resin obtained by copolymerization of a monomer having an adsorbing group, a monomer having a hydrophilic group and a monomer having a crosslinkable group.

The polymer resin for undercoat layer preferably has an adsorbing group to the hydrophilic surface of the support. Whether adsorptivity to the hydrophilic surface of the support is present or not can be judged, for example, by the following method.

A test compound is dissolved in an easily soluble solvent to prepare a coating solution, and the coating solution is coated and dried on a support so as to have the coating amount after drying of 30 mg/m$^2$. After thoroughly washing the support coated with the test compound using the easily soluble solvent, the residual amount of the test compound that has not been removed by the washing is measured to calculate the adsorption amount of the test compound to the support. For measuring the residual amount, the residual amount of the test compound may be directly determined, or may be calculated by determining the amount of the test compound dissolved in the washing solution. The determination for the test compound can be performed, for example, by X-ray fluorescence spectrometry measurement, reflection absorption spectrometry measurement or liquid chromatography measurement. The compound having the adsorptivity to support is a compound that remains by 1 mg/m² or more even after conducting the washing treatment described above.

The adsorbing group to the hydrophilic surface of the support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the hydrophilic surface of the support. The adsorbing group is preferably an acid group or a cationic group.

The acid group preferably has an acid dissociation constant (pKa) of 7 or less. Examples of the acid group include a phenolic hydroxy group, a carboxyl group, —SO₃H, —OSO₃H, —PO₃H₂, —OPO₃H₂, —CONHSO₂—, —SO₂NHSO₂— and —COCH₂COCH₃. Among them, —OPO₃H₂ and —PO₃H₂ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferable examples of the monomer having the adsorbing group which is used in the synthesis of the polymer resin suitable for the compound for undercoat layer include a compound represented by the following formula (U1) or (U2):

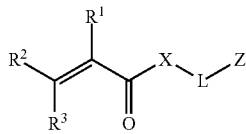

(U1)

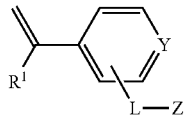

(U2)

In formulae (U1) and (U2), $R^1$, $R^2$ and $R^3$ each independently represents a hydrogen atom, halogen atom or an alkyl group having from 1 to 6 carbon atoms.

$R^1$, $R^2$ and $R^3$ each independently represents preferably a hydrogen atom or an alkyl group having from 1 to 6 carbon atoms, more preferably a hydrogen atom or an alkyl group having from 1 to 3 carbon atoms, most preferably a hydrogen atom or a methyl group. It is particularly preferred that $R^2$ and $R^3$ each represents a hydrogen atom.

Z represents a functional group adsorbing to the hydrophilic surface of the support. With respect to the adsorbing functional group, the above description on the adsorbing group can be referred to.

In formulae (U1) and (U2), L represents a single bond or a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted alylene group), a divalent heterocyclic group or a combination of each of the groups described above with an oxygen atom (—O—), a sulfur atom (—S—), an imino group (—NH—), a substituted imino group (—NR—, where R represents an aliphatic group, an aromatic group or a heterocyclic group) or a carbonyl group (—CO—).

The divalent aliphatic group may form a cyclic structure or a branched structure. The number of carbon atoms of the divalent aliphatic group is preferably from 1 to 20, more preferably from 1 to 15, most preferably from 1 to 10. It is preferred that the divalent aliphatic group is a saturated aliphatic group rather than an unsaturated aliphatic group. The divalent aliphatic group may have a substituent. Examples of the substituent include a halogen atom, a hydroxy group, an aromatic group and a heterocyclic group.

The number of carbon atoms of the divalent aromatic group is preferably from 6 to 20, more preferably from 6 to 15, most preferably from 6 to 10. The divalent aromatic group may have a substituent. Examples of the substituent include a halogen atom, a hydroxy group, an aliphatic group, an aromatic group and a heterocyclic group.

It is preferred that the divalent heterocyclic group has a 5-membered or 6-membered ring as the hetero ring. Other heterocyclic ring, an aliphatic ring or an aromatic ring may be condensed to the heterocyclic ring. The divalent heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred according to the invention that L represents a divalent connecting group containing a plurality of polyoxyalkylene structures. It is more preferred that the polyoxyalkylene structure is a polyoxyethylene structure. Specifically, it is preferred that L contains —(OCH₂CH₂)ₙ— (n is an integer of 2 or more).

In formula (U1), X represents an oxygen atom (—O—) or imino group (—NH—). Preferably, X represents an oxygen atom.

In formula (U2), Y represents a carbon atom or a nitrogen atom. In the case where Y is a nitrogen atom and L is connected to Y to form a quaternary pyridinium group, Z is not mandatory and may represents a hydrogen atom because the quaternary pyridinium group itself exhibits the adsorptivity.

Representative examples of the compound represented by formula (U1) or (U2) are set forth below.

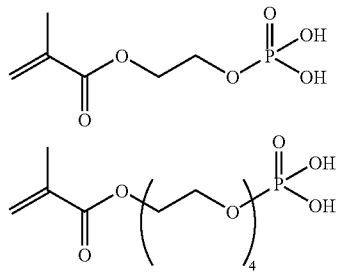

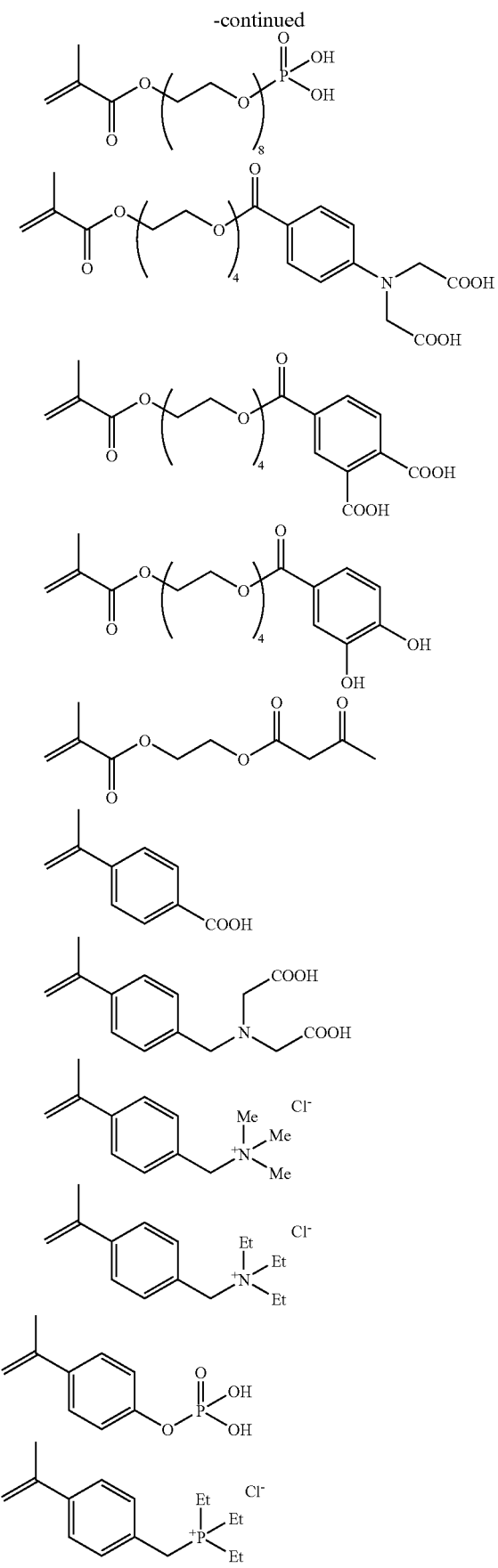

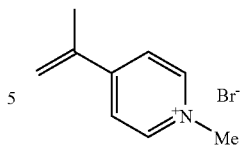

The polymer resin suitable for the compound for undercoat layer preferably has a hydrophilic group. The hydrophilic group preferably includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group and a phosphoric acid group. Among them, a sulfo group exhibiting a highly hydrophilic property is preferable.

Specific examples of the monomer having a sulfo group include a sodium salt or amine salt of methallyloxybenzenesulfonic acid, allyloxybenzenesulfonic acid, allylsulfonic acid, vinylsulfonic acid, p-styrenesulfonic acid, methallylsulfonic acid, acrylamido-tert-butylsulfonic acid, 2-acrylamido-2-methylpropanesulfonic acid or (3-acryloyloxypropyl)buthylsulfonic acid. Among them, from the standpoint of the hydrophilic property and handling property in the synthesis thereof sodium salt of 2-acrylamido-2-methylpropanesulfonic acid is preferable.

The monomer is preferably used in the synthesis of the polymer resin suitable for the compound for undercoat layer.

It is preferred that the polymer resin for undercoat layer according to the invention has a crosslinkable group. The crosslinkable group acts to improve the adhesion property to the image area. In order to impart the crosslinking property to the polymer resin for undercoat layer, introduction of a crosslinkable functional group, for example, an ethylenically unsaturated bond into the side chain of the polymer or introduction by formation of a salt structure between a polar substituent of the polymer resin and a compound containing a substituent having a counter charge to the polar substituent of the polymer resin and an ethylenically unsaturated bond is used.

Examples of the polymer having the ethylenically unsaturated bond in the side chain thereof include a polymer of an ester or amide of acrylic acid or methacrylic acid, wherein the ester or amide residue (R in —COOR or —CONHR) has the ethylenically unsaturated bond.

Examples of the residue (R described above) having an ethylenically unsaturated bond include —(CH$_2$)$_n$CR$_1$=CR$_2$R$_3$, —(CH$_2$O)$_n$CH$_2$CR$_1$=CR$_2$R$_3$, —(CH$_2$CH$_2$O)$_n$CH$_2$CR$_1$=CR$_2$R$_3$, —(CH$_2$)$_n$NH—CO—O—CH$_2$CR$_1$=CR$_2$R$_3$, —(CH$_2$)$_n$—O—CO—CR$_1$=CR$_2$R$_3$ and —(CH$_2$CH$_2$O)$_2$—X (wherein R$_1$ to R$_3$ each represents a hydrogen atom, a halogen atom or an alkyl group having from 1 to 20 carbon atoms, an aryl group, alkoxy group or arytoxy group, or R$_1$ and R$_2$ or R$_1$ and R$_3$ may be combined with each other to form a ring. n represents an integer of 1 to 10. X represents a dicyclopentadienyl residue).

Specific examples of the ester residue include —CH$_2$CH=CH$_2$ (described in JP-B-7-21633) —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$O—Y (wherein Y represents a cyclohexene residue) and —CH$_2$CH$_2$OCO—CH=CH$_2$.

As a monomer having a crosslinkable group for the polymer resin for undercoat layer, an ester or amide of acrylic acid or methacrylic acid having the crosslinkable group described above is preferably used.

The content of the crosslinkable group in the polymer resin for undercoat layer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the polymer resin. In the range described above, preferable compatibility between the sensitivity and stain resistance and good preservation stability can be achieved.

The weight average molecular weight of the polymer resin for undercoat layer is preferably 5,000 or more, more preferably from 10,000 to 300,000. The number average molecular weight of the polymer resin is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer, a graft polymer and the like, and is preferably a random polymer.

The polymer resins for undercoat layer may be used individually or in a mixture of two or more thereof.

A coating solution for undercoat layer is obtained by dissolving the polymer resin for undercoat layer in an organic solvent (for example, methanol, ethanol, acetone or methyl ethyl ketone) and/or water.

The coating solution for undercoat layer may contain an infrared absorbing agent.

In order to coat the coating solution for undercoat layer on the support, various methods can be used. Examples of the method include bar coater coating, spin coating, spray coating, curtain coating, dip coating, air knife coating, blade coating and roll coating.

The coating amount (solid content) of the undercoat layer is preferably from 0.1 to 100 mg/m$^2$, more preferably from 1 to 30 mg/m$^2$.

<Printing Method>

A lithographic printing plate obtained by the plate making including the imagewise exposure and development processing according to the invention is mounted on a plate cylinder of a printing machine and used for printing a large number of sheets by supplying dampening water and printing ink.

EXAMPLES

The present invention will be described in more detail with reference to the following examples, but the invention should not be construed as being limited thereto.

[Preparation of Lithographic Printing Plate Precursor]
1. Preparation of Lithographic Printing Plate Precursor (1)
(1) Preparation of Support (1)

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried.

Then, water vapor of 100° C. was splayed onto the anodized film of the plate under a pressure of 1.033×10$^5$ Pa for 8 seconds to perform a sealing treatment.

In order to ensure the hydrophilicity of the non-image area, the plate was subjected to a silicate treatment using an aqueous 2.5% by weight sodium silicate No. 3 solution at 75° C. for 6 seconds. The adhesion amount of Si was 10 mg/m$^2$. Subsequently, the plate was washed with water to obtain Support (1). The center line average roughness (Ra) of Support (1) was measured using a stylus having a diameter of 2 μm and found to be 0.51 μm.

(2) Formation of Undercoat Layer

Coating solution (1) for undercoat layer shown below was coated on Support (1) so as to have a dry coating amount of 20 mg/m$^2$ to prepare a support for use in the following experiments.

| <Coating solution (1) for undercoat layer> | |
|---|---|
| Compound (1) for undercoat layer having structure shown below | 0.18 g |
| Methanol | 55.24 g |
| Water | 6.15 g |

-continued

<Coating solution (1) for undercoat layer>

Compound (1) for undercoat layer:

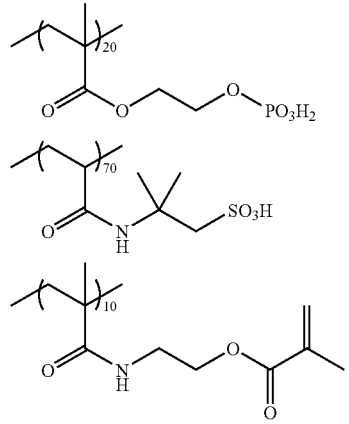

(3) Formation of Image-Recording Layer

Coating solution (1) for image-recording layer having the composition shown below was coated on the undercoat layer provided on the support by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive solution (1)>

| | |
|---|---|
| Binder polymer (1) having structure shown below | 0.240 g |
| Infrared absorbing agent (1) having structure shown below [Component (A)] | 0.030 g |
| Polymerization initiator (1) having structure shown below [Component (B)] | 0.162 g |
| Polymerizable compound (tris(acryloyloxyethyl) isocyanulate (NK Ester A-9300, produced by Shin-Nakamura Chemical Co., Ltd.)) [Component (C)] | 0.192 g |
| Tris(2-hydroxyethyl) isocyanulate | 0.062 g |
| Pionine A-20 (produced by Takemoto Oil and Fat Co., Ltd.) | 0.055 g |
| Benzyl dimethyl octyl ammonium PF$_6$ salt | 0.018 g |
| Fluorine-based surfactant (1) having structure shown below | 0.008 g |
| Methyl ethyl ketone | 1.091 g |
| 1-Methoxy-2-propanol | 8.609 g |

<Microgel solution (1)>

| | |
|---|---|
| Microgel (1) | 2.640 g |
| Distilled water | 2.425 g |

The structures of Infrared absorbing agent (1), Polymerization initiator (1), Binder polymer (1) and Fluorine-based surfactant (1) are shown below.

Binder polymer (1):

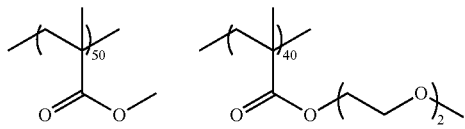

Weight average molecular weight: 70,000

Infrared absorbing agent (1):

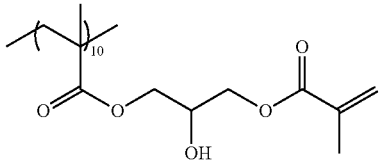

Polymerization initiator (1):

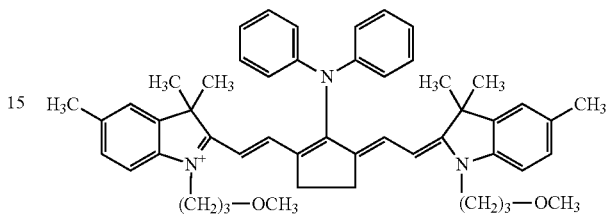

Fluorine-based surfactant (1):

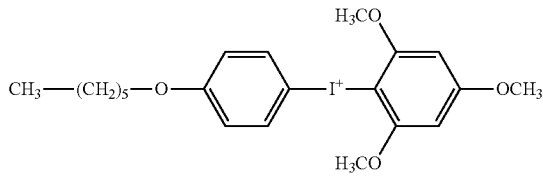

Microgel (1) described above was prepared in the following manner.

(Preparation of Microgel (1))

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.) and 0.1 g of Pionine A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of Microgel (1) was measured by light scattering method and found to be 0.2 μm.

(3) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursor (1).

| <Coating solution (1) for protective layer> | |
|---|---|
| Dispersion of inorganic stratiform compound (1) | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (Emalex 710, produced by Nihon Emulsion Co., Ltd. | 8.60 g |
| Ion-exchanged water | 6.0 g |

(Preparation of Dispersion of Inorganic Stratiform Compound (1))

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

2. Preparation of Lithographic Printing Plate Precursor (2)

Lithographic printing plate precursor (2) was prepared in the same manner as in the preparation of lithographic printing plate precursor (1) except for changing Coating solution (1) for image-recording layer to Coating solution (2) for image-recording layer.

| <Coating solution (2) for image-recording layer> | |
|---|---|
| Binder polymer (1) having structure shown above | 0.50 g |
| Infrared absorbing agent (2) having structure shown below [Component (A)] | 0.05 g |
| Polymerization initiator (1) having structure shown above [Component (B)] | 0.20 g |
| Polymerizable compound (Aronics M-215, produced by Toagosei Co., Ltd.) [Component (C)] | 1.00 g |
| Sodium n-heptylsulfonate | 0.05 g |
| Benzyl dimethyl octyl ammonium $PF_6$ salt | 0.018 g |
| Fluorine-based surfactant (1) having structure shown above | 0.10 g |
| Methyl ethyl ketone | 18.0 g |

Infrared absorbing agent (2):

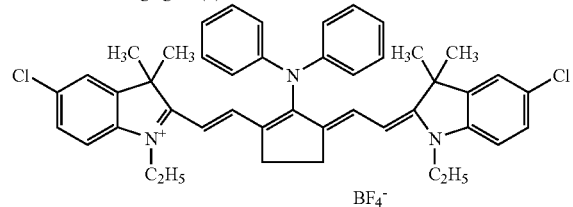

3. Preparation of Lithographic Printing Plate Precursor (3)

Coating solution (3) for image-recording layer having the composition shown below was coated on the above-described support provided with the undercoat layer by a bar and dried in an oven at 70° C. for 60 seconds to form an image-recording layer having a dry coating amount of 0.6 g/m².

| <Coating solution (3) for image-recording layer> | |
|---|---|
| Aqueous dispersion of polymer fine particle (hydrophobilizing precursor) [Component (D)] | 33.0 g |

| <Coating solution (3) for image-recording layer> | |
|---|---|
| Inflated absorbing agent (3) having structure shown below [Component (A)] | 1.0 g |
| Pentaerythritol tetraacrylate | 0.5 g |
| Disodium 1,5-naphthalenedisulfonate | 0.1 g |
| Methanol | 16.0 g |

Infrared absorbing agent (3):

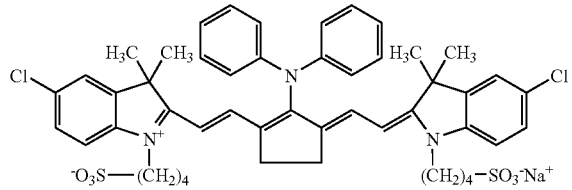

(Preparation of Aqueous Dispersion of Polymer Fine Particle (Hydrophobilizing Precursor))

A stirrer, a thermometer, a dropping funnel, a nitrogen inlet tube and a reflux condenser were attached to a 1,000 ml four-neck flask and while carrying out deoxygenation by introduction of nitrogen gas, 350 ml of distilled water was charged therein and heated until the internal temperature reached 80° C. To the flask was added 1.5 g of sodium dodecylsufate as a dispersing agent, then was added 0.45 g of ammonium persulfate as an initiator, and thereafter was dropwise added a mixture of 45.0 g of glycidyl methacrylate and 45.0 g of styrene through the dropping funnel over a period of about one hour. After the completion of the dropwise addition, the mixture was continued to react as it was for 5 hours, followed by removing the unreacted monomers by steam distillation. The mixture was cooled, adjusted the pH to 6 with aqueous ammonia and finally added pure water thereto so as to have the nonvolatile content of 15% by weight to obtain an aqueous dispersion of polymer fine particle (hydrophobilizing precursor). The particle size distribution of the polymer fine particle had the maximum value at the particle size of 60 nm.

The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

Coating solution (2) for protective layer shown below was coated on the image-recording layer thus-prepared by a bar and dried in an oven at 60° C. for 120 seconds to form a protective layer having a dry coating amount of 0.3 g/m², thereby preparing Lithographic printing plate precursor (3).

| <Coating solution (2) for protective layer> | |
|---|---|
| Carboxymethyl cellulose (weight average molecular weight: 20,000) | 5.0 g |
| Water | 50.0 g |

Examples 1 to 12 and Comparative Examples 1 to 6

Exposure

The exposure of lithographic printing plate precursor was performed under two conditions, specifically, Exposure A and Exposure B.

Exposure (A)

Each of Lithographic printing plate precursors (1) to (3) thus-obtained was exposed by Luxel Platesetter T-6000III equipped with an infrared semiconductor laser, produced by Fuji Film Co., Ltd. under the conditions of a rotational number of outer surface drum of 1,000 rpm, a laser output of 70% and a resolution of 2,400 dpi. The exposed image contained a fine line image.

Exposure (B)

Each of Lithographic printing plate precursors (1) to (3) thus-obtained was exposed by Trendsetter 3244VX, produced by Creo Co., equipped with an infrared semiconductor laser, under the conditions of an output of 6.4 W, a rotational number of outer surface drum of 150 rpm and a resolution of 2,400 dpi. The exposed image contained a solid image and a halftone dot gradation chart of a 20 μm-dot FM screen.

(Development Processing)

The exposed lithographic printing plate precursor was subjected to development processing using an automatic development apparatus having a structure shown in FIG. 1. The process of removing the unexposed area of the image-recording layer, process of washing with water and process of oil-desensitizing were carried out in the developing unit 14, the water washing unit 16 and the oil-desensitizing treatment unit 18 in FIG. 1 using the processing solutions shown in Table 1, respectively.

The conditions for the development processing are shown below.

Temperature of processing solution: all 25° C.

Transporting speed; 100 cm/min

Rotation number of brush roller in developing unit: 100 rpm (Evaluation)

(1) Evaluation of Reattachment of the Component of Image-Recording Layer Removed The surface of the lithographic printing plate obtained by conducting after the exposure (Exposure (A)), the development processing described above was visually observed and the extent of reattachment of the component of image-recording layer which had been removed with the development was evaluated according to the criteria shown below.

A: Reattachment of the component removed was not observed at all so in an excellent level.

B: Reattachment of the component removed was slightly observed but it could be readily removed with a waste cloth or the like so in an acceptable level.

C: Reattachment of the component removed was much and it could not be readily removed by wiping with a waste cloth so in an unacceptable level.

D: Reattachment of the component removed was very much so in a poor level

The results obtained are shown in Table 1.

(2) Evaluation of Reproducibility of Fine Line

The lithographic printing plate obtained by conducting after the exposure (Exposure (A)), the development processing described above was mounted on a plate cylinder of a printing machine (Lithrone 26, produced by Komori Corp.). Using dampening water (Ecolity-2 (produced by Fuji Film Co., Ltd.)/tap water=2/98 (volume ratio)) and Values-G (N) Black Ink (produced by Dainippon Ink & Chemicals, Inc.), the dampening water and ink were supplied according to the standard automatic printing start method of Lithrone 26 to initiate printing and the printing on 100 sheets of Tokubishi art paper (76.5 kg) was conducted at a printing speed of 10,000 sheets per hour.

The evaluation of reproducibility of fine line was performed as a means for evaluating whether the removal of the unexposed area of the image-recording layer was carried out as desired by the development processing described above. Specifically, of the exposed fine lines (test chart including white fine lines (fine linear unexposed portions in the image area) the width of which was varied from 10 to 50 μm every 2 μm), the limit of the width of fine line capable of being reproduced on a printing paper was determined according to the visual observation of the width of white fine line reproduced on the printing paper. It is indicated that as the value becomes small, finer line can be well developed and more preferable result is obtained. The results obtained are shown in Table 1.

(3) Evaluation of Stain Resistance

The lithographic printing plate obtained by conducting after the exposure (Exposure (B)), the development processing described above was mounted on a plate cylinder of a printing machine (Speedmaster 52, produced by Heidelberg Co.). Using dampening water (IF102 (etching solution, produced by Fuji Film Co., Ltd.)/water=3/97 (volume ratio)) and Trans-G (N) Black Ink (produced by Dainippon Ink & Chemicals, Inc.), the dampening water and ink were supplied and printing of 100 sheets was conducted at a printing speed of 6,000 sheets per hour.

Then, the scale for dampening water of the printing machine was turn down to gradually decrease the supplying amount of the dampening water until tangle in the halftone dot image occurred. The extent of the tangle stain occurred was evaluated according to the criteria shown below. The results obtained are shown in Table 1.

A: Tangle stain hardly occurred and sufficient water/ink balance was maintained so in a good level.

B: Slight tangle stain occurred but in an acceptable level.

C: Tangle stain occurred and halftone dots in the shadow region were collapsed so in an unacceptable level.

D: Very bad tangle stain occurred just after decreasing a little the supplying amount of the dampening water.

From the results shown in Table 1, it can be seen that by the plate making method of lithographic printing plate precursor according to the invention, good effect of preventing the reattachment of component removed and good developing property are achieved and the lithographic printing plate excellent in stain resistance at the printing is obtained as in all of Examples 1 to 12.

TABLE 1

EXAMPLES 1 TO 12 AND COMPARATIVE EXAMPLES 1 TO 6

| | Lithographic Printing Plate Precursor | Condition of Development Processing | | | Evaluation Result of Printing | | |
|---|---|---|---|---|---|---|---|
| | | Process of Removing Image-Recording Layer | Process of Washing with Water (water quality) | Process of Oil-sensitizing | Reattachment of Component Removed | Reproducibility of Fine Line | Stain Resistance |
| Example 1 | (1) | Gum Solution 1 | Fresh Water | Gum Solution 1 | A | 10 | A |
| Example 2 | (1) | Gum Solution 2 | Fresh Water | Gum Solution 2 | A | 10 | A |
| Example 3 | (1) | Gum Solution 3 | Fresh Water | Gum Solution 3 | A | 15 | A |
| Example 4 | (1) | Gum Solution 2 | Fresh Water | Gum Solution 3 | A | 10 | B |
| Example 5 | (1) | Gum Solution 2 | Circulating Water 1 | Gum Solution 2 | A | 10 | A |
| Example 6 | (1) | Gum Solution 2 | Circulating Water 2 | Gum Solution 2 | B | 10 | A |
| Example 7 | (2) | Gum Solution 2 | Fresh Water | Gum Solution 2 | B | 10 | A |
| Example 8 | (2) | Gum Solution 2 | Fresh Water | Gum Solution 3 | B | 10 | B |
| Example 9 | (2) | Gum Solution 2 | Circulating Water 1 | Gum Solution 2 | B | 10 | A |
| Example 10 | (3) | Gum Solution 2 | Fresh Water | Gum Solution 2 | A | 10 | B |
| Example 11 | (3) | Gum Solution 2 | Fresh Water | Gum Solution 3 | A | 10 | B |
| Example 12 | (3) | Gum Solution 2 | Circulating Water 1 | Gum Solution 2 | A | 10 | B |
| Comparative Example 1 | (1) | Gum Solution 2 | None | None | D | 10 | B |
| Comparative Example 2 | (3) | Gum Solution 3 | None | None | C | 15 | D |
| Comparative Example 3 | (1) | Gum Solution 2 | Fresh Water | None | A | 10 | D |
| Comparative Example 4 | (3) | Gum Solution 3 | Fresh Water | None | A | 10 | D |
| Comparative Example 5 | (1) | Aqueous Solution 1 | Fresh Water | Gum Solution 2 | C | 40 | B |
| Comparative Example 6 | (1) | Gum Solution 2 | None | Gum Solution 2 | C | 10 | C |

The compositions of the gum solutions and the water quality of the washing water used in Table 1 are shown below.

<Gum solution 1>

| | |
|---|---|
| Gum arabic | 1.6% by weight |
| Enzyme-modified potato starch | 8.8% by weight |
| Phosphorylated waxy corn starch | 0.80% by weight |
| Sodium salt of dioctylsulfosuccinic acid ester | 0.10% by weight |
| Citric acid | 0.14% by weight |
| α-alanine | 0.11% by weight |
| Tetrasodium salt of EDTA | 0.10% by weight |
| Disodium salt of dodecyldiphenyl ether disulfonic acid | 0.18% by weight |
| Ethylene glycol | 0.72% by weight |
| Benzyl alcohol | 0.87% by weight |
| Sodium dehydroacetate | 0.04% by weight |
| Emulsion type silicone defoaming agent | 0.01% by weight |
| Water to make | 100% by weight | pH: 5.0

<Gum solution 2>

Gum Solution FN-6 (produced by Fuji Film Co., Ltd.)/tap water = 1/1
pH: 3.5

<Gum solution 3>

| | |
|---|---|
| Anionic surfactant (Dowfax 3B2, produced by Dow Chemical Co.) | 100 ml |
| Disodium salt of 1,3-benzenedisulfonic acid produced by Riedel de Haan) | 31.25 g |
| Polystyrenesulfoninc acid (Versa TL77, produced by Alco Chemical) | 31.25 g |
| Trisodium citrate dihydrate | 10.4 g |
| Antiseptic agent (Acticide LA1206, produced by Thor) | 2 ml |
| Polyoxyethylene (Polyox WSRN-750, produced by Union Carbide Corp.) | 2.08 g |
| Water | 1,750 g | pH: 7.5

<Aqueous solution 1>

| | |
|---|---|
| Sodium 7-n-butylnaphthalene-2-sulfate | 300 g |
| Polyethylene oxide-2-naphthyl ether | 100 g |
| Benzyl alcohol | 50 g |
| Water | 9,550 g |

[Water Quality of Washing Water Used in Process of Washing with Water]

<Fresh Water>

Fresh tap water was constantly used (no reuse).

<Circulating Water 1>

Reuse water circulating by a pump was used. Specifically, water once used in the process of washing with water was filtered through a cartridge filter TCW-75N-PPS (mesh diameter: 75 μm) produced by Advantec Mfs, Inc. and then reused.

<Circulating Water 2>

Reuse water circulating by a pump was used. The filtration was not conducted.

This application is based on Japanese Patent application JP 2007-240744, filed Sep. 18, 2007, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A plate making method of a lithographic printing plate precursor comprising:
   exposing a lithographic printing plate precursor comprising an image-recording layer and a support; and developing the exposed lithographic printing plate precursor to prepare a lithographic printing plate,
wherein the developing comprises, in the following order,
(i) a process of removing an unexposed area of the image-recording layer with a gum solution,
(ii) a process of washing with water, and
(iii) a process of oil-desensitizing a non-image area with said gum solution, wherein said gum solution used in the process (i) of removing and the gum solution used in the process (iii) of oil-desensitizing have the same composition.

2. The plate making method of a lithographic printing plate precursor as claimed in claim 1, wherein the water used in the process (ii) of washing is fresh water or reuse water circulating through a filter.

3. The plate making method of a lithographic printing plate precursor as claimed in claim 1, wherein the image-recording layer comprises (A) an infrared absorbing agent, (B) a polymerization initiator and (C) a polymerizable compound.

4. The plate making method of a lithographic printing plate precursor as claimed in claim 1, wherein the image-recording layer comprises (A) an infrared absorbing agent and (D) a hydrophobilizing precursor.

5. The plate making method of a lithographic printing plate precursor as claimed in claim 1, wherein the lithographic printing plate precursor further comprises a protective layer, so that the support, the image-recording layer and the protective layer are provided in this order.

6. The plate making method of a lithographic printing plate precursor as claimed in claim 5, wherein the protective layer comprises an inorganic stratiform compound.

7. The plate making method of a lithographic printing plate precursor comprising:
exposing a lithographic printing plate precursor comprising an image-recording layer and a support; and
developing the exposed lithographic printing plate precursor to prepare a lithographic printing plate,
wherein the developing comprises, in the following order,
(i) a process of removing an unexposed area of the image-recording layer with a gum solution,
(ii) a process of washing with water, and
(iii) a process of oil-desensitizing a non-image area with said gum solution, wherein the gum solution stocked in a tank for the process (i) of removing and the gum solution stocked in a tank for the process (iii) of oil-desensitizing are the same solutions.

* * * * *